(12) United States Patent
Choi

(10) Patent No.: US 12,068,133 B2
(45) Date of Patent: Aug. 20, 2024

(54) REACTOR, PROCESS PROCESSING APPARATUS INCLUDING THE SAME AND METHOD FOR MANUFACTURING REACTOR

(71) Applicant: NP Holdings Co., Ltd., Suwon-si (KR)

(72) Inventor: Dai Kyu Choi, Yongin-si (KR)

(73) Assignee: NP HOLDINGS CO., LTD., Suwon-Si (KR)

( * ) Notice: Subject to any disclaimer, the term of this patent is extended or adjusted under 35 U.S.C. 154(b) by 264 days.

(21) Appl. No.: 17/578,648

(22) Filed: Jan. 19, 2022

(65) Prior Publication Data
US 2022/0238304 A1 Jul. 28, 2022

(30) Foreign Application Priority Data

Jan. 25, 2021 (KR) .................. 10-2021-0010241

(51) Int. Cl.
*H01J 37/32* (2006.01)
*H01L 21/67* (2006.01)

(52) U.S. Cl.
CPC .... *H01J 37/3244* (2013.01); *H01J 37/32458* (2013.01); *H01L 21/67017* (2013.01)

(58) Field of Classification Search
None
See application file for complete search history.

(56) References Cited

U.S. PATENT DOCUMENTS

| | | | | |
|---|---|---|---|---|
| 5,273,610 A | * | 12/1993 | Thomas, III | H01J 37/32935 324/96 |
| 5,998,933 A | * | 12/1999 | Shun'ko | H05H 1/46 156/345.48 |
| 6,164,241 A | * | 12/2000 | Chen | H01J 37/321 427/569 |
| 6,228,229 B1 | * | 5/2001 | Raaijmakers | H01J 37/321 204/192.15 |
| 6,531,029 B1 | * | 3/2003 | Ni | H01J 37/321 219/121.52 |
| 6,939,434 B2 | * | 9/2005 | Collins | H01J 37/32082 118/723 MR |
| 7,264,688 B1 | * | 9/2007 | Paterson | H01J 37/321 118/723 R |
| 2002/0157793 A1 | * | 10/2002 | Cox | H01J 37/32009 156/345.48 |
| 2003/0015965 A1 | * | 1/2003 | Godyak | H01J 37/32009 315/111.21 |

(Continued)

FOREIGN PATENT DOCUMENTS

WO WO-2014046864 A1 * 3/2014 ......... C23C 16/4404
WO WO-2014143775 A1 * 9/2014 ............. C23C 16/26

OTHER PUBLICATIONS

US 5,237,958 A, 08/1993, Dalvie et al. (withdrawn)*

*Primary Examiner* — Srinivas Sathiraju
(74) *Attorney, Agent, or Firm* — NKL LAW; Jae Youn Kim

(57) ABSTRACT

Proposed is a reactor that is formed by assembling a plurality of components. The reactor includes a body, in which a plurality of components are assemble, and that has a plasma forming space in an interior thereof, and an assembly line for the components is formed in an area that deviates from an area that is closest to an area of the plasma forming space of the body, in which plasma is concentrated, by a specific range.

11 Claims, 21 Drawing Sheets

(56) References Cited

U.S. PATENT DOCUMENTS

| | | | |
|---|---|---|---|
| 2003/0047449 A1* | 3/2003 | Hanawa | H01J 37/32174 |
| | | | 156/345.48 |
| 2003/0067273 A1* | 4/2003 | Benjamin | H01J 37/321 |
| | | | 315/111.21 |
| 2003/0168172 A1* | 9/2003 | Glukhoy | H01J 37/32082 |
| | | | 118/723 AN |
| 2003/0176074 A1* | 9/2003 | Paterson | H01J 37/32458 |
| | | | 438/709 |
| 2004/0107907 A1* | 6/2004 | Collins | H01J 37/32082 |
| | | | 118/723 I |
| 2004/0112542 A1* | 6/2004 | Collins | H01J 37/32082 |
| | | | 156/345.48 |
| 2005/0136604 A1* | 6/2005 | Al-Bayati | H01L 29/7843 |
| | | | 438/301 |
| 2008/0173237 A1* | 7/2008 | Collins | H01J 37/32477 |
| | | | 118/723 R |
| 2012/0212136 A1* | 8/2012 | Einav | H01J 37/321 |
| | | | 315/111.41 |
| 2014/0272108 A1* | 9/2014 | Holber | C23C 16/272 |
| | | | 118/723 R |
| 2018/0130639 A1* | 5/2018 | Vranich | H01J 37/32082 |
| 2022/0238304 A1* | 7/2022 | Choi | H01J 37/3244 |
| 2022/0364233 A1* | 11/2022 | Hammond | C23C 16/509 |

* cited by examiner

REACTOR, PROCESS PROCESSING APPARATUS INCLUDING THE SAME AND METHOD FOR MANUFACTURING REACTOR

CROSS-REFERENCE TO RELATED APPLICATIONS

This application claims priority under 35 U.S.C. § 119 to Korean Patent Application No. 10-2021-0010241 filed on Jan. 25, 2021, in the Korean Intellectual Property Office, the disclosures of which are incorporated by reference herein in their entireties.

BACKGROUND

Embodiments of the inventive concept described herein relate to a reactor for a plasma generating apparatus, a process processing apparatus including the same, and a method for manufacturing the reactor.

Activated gases using plasma discharging have been widely used in various fields, and have been variously used representatively for semiconductor manufacturing processes, for example, etching, deposition, cleaning, and treatment of process side-products. The plasma used for the semiconductor manufacturing processes may be generated in an interior of a reactor that may endure heat that is generated when the plasma is generated.

FIG. 1 is a perspective view illustrating an example of a general reactor 1. FIG. 2 is a front cross-sectional view of a reactor 1 of FIG. 1. In FIG. 2, an arrow 2 indicates a path along which a gas and plasma flow.

Referring to FIGS. 1 and 2, the conventional reactor 1 may be formed of a quartz material having a heat-resistant property, may have a structure that has a toroid-shaped body 5, in which an inlet 3, through which a gas is introduced, is provided on an upper surface thereof and an outlet 4, through which the gas and/or the plasma is discharged, is provided on a bottom surface thereof. The reactor 1 is generally formed by assembling a plurality of components through welding. The components are formed by cutting a plate of a quartz material, and for convenience of cutting, the reactor 1 having the shape is formed by assembling the components 7 and 8 that is divided with respect to an assembly line 6 formed along an imaginary plane that is parallel to a direction, in which the body 5 surrounds a central portion of the toroid shape. The welding for assembling the components 7 and 8 is performed along the assembly line 6.

However, a plasma loop tends to be inclined to an area that is adjacent to the central portion of the toroid shape in an interior of the reactor 1 according to a property of the plasma of flowing in a shortest path from the inlet 3 to the outlet 4, and accordingly, an area, in which a density of the plasma is concentrated, overlaps the assembly line 6 whereby an amount of particles due to the plasma reaction increases.

SUMMARY

Embodiments of the inventive concept provide a reactor that is formed such that an assembly line deviates from an area, in which a density of a plasma loop is concentrated.

Embodiments of the inventive concept provide a reactor that may reduce an amount of particles.

Embodiments of the inventive concept provide a process processing apparatus that employs the reactor.

The inventive concept provides a reactor that has a plasma channel. According to an embodiment, the reactor includes a body, in which a plurality of components are assembled, and that has a plasma forming space in an interior thereof, and an assembly line for the components is formed in an area that deviates from an area that is closest to an area of the plasma forming space of the body, in which plasma is concentrated, by a specific range.

The body may have a toroid shape, and the assembly line may be formed in an area that deviates from an inner line that is closest to a central portion of the toroid shape of the body, by a specific range.

The component may include an inner ring component including the inner line, and an outer ring component surrounding an outside of the inner ring component.

The inner ring component may correspond to an area extending from the inner line of the body to opposite sides along an outer peripheral direction thereof, and may be provided in a range of 20% to 95% of the body with respect to a cross-section obtained by cutting an area, except for an area, in which an inlet and an outlet of the body are formed, in a direction that is perpendicular to a direction, the body surrounds the central portion of the toroid shape.

The outer ring component may include a plurality of outer components.

The body may have an inlet, through which a gas is introduced into the plasma forming space, and an outlet, through which a fluid is discharged from the plasma forming space to an outside, and the reactor may further include an inlet pipe assembled in an area surrounding the inlet, and an outer pipe assembled in an area surrounding the outlet.

The reactor may further include a distribution member configured to distribute the gas introduced through the inlet pipe, and the distribution member may be integrally formed with the inlet pipe.

The number of at least one of inlets and outlets may be plural.

The body may include a plurality of sub-bodies, the sub-bodies may have toroid shapes, central portions of the toroid shapes are arranged along an imaginary straight line, and a direction, in which the central portion of the toroid shapes of the sub-bodies are surrounded, are provided perpendicularly to the straight line, and the assembly line may be formed in an area that deviates from an inner line that is closest to a central portion of the toroid shape of the body, by a specific range.

Further, the inventive concept provides a process processing apparatus. According to an embodiment, a process processing apparatus includes a process chamber configured to treat a substrate, and a plasma treatment apparatus configured to supply plasma to the process chamber, the plasma treatment apparatus includes a reactor formed by assembling a plurality of components, the reactor includes a body having a plasma forming space in an interior thereof, and having an inlet, through which a gas is introduced into the plasma forming space, and an outlet, through which a fluid is discharged from the plasma forming space to an outside, and an assembly line for the components is formed in an area that deviates from an area that is closest to an area of the plasma forming space, in which plasma is concentrated, by a specific range.

According to an embodiment, a process processing apparatus includes a process chamber configured to treat a substrate, and an exhaust gas treating part configured to treat an exhaust gas exhausted from the process chamber, the exhaust gas treating part includes a plasma treatment apparatus that generates plasma to burn the exhaust gas, and a collection part that collects foreign substances from a treatment fluid generated in a process of burning the exhaust gas by the plasma treatment apparatus, the plasma treatment apparatus includes a reactor formed by assembling a plurality of components, the reactor includes a body having a plasma forming space in an interior thereof, and having an inlet, through which a gas is introduced into the plasma forming space, and an outlet, through which a fluid is discharged from the plasma forming space to an outside, and an assembly line for the components is formed in an area that deviates from an area that is closest to an area of the plasma forming space, in which plasma is concentrated, by a specific range.

Furthermore, the inventive concept provides a method for manufacturing a reactor formed by assembling a plurality of components. According to an embodiment, the reactor includes a body having a plasma forming space in an interior thereof, and having an inlet, through which a gas is introduced into the plasma forming space, and an outlet, through which a fluid is discharged from the plasma forming space to an outside, and an assembly line for the components is formed in an area that deviates from an area that is closest to an area of the plasma forming space, in which plasma is concentrated, by a specific range, and the method includes forming the components by machining a raw material, and assembling the components.

The forming of the components may include machining an area of the raw material corresponding to an inner surface of the reactor, and machining an area of the raw material corresponding to an outer surface of the reactor, and the machining of the area of the raw material corresponding to the inner surface of the reactor may be performed before the assembling of the components, and the machining of the area of the raw material corresponding to the outer surface of the reactor may be performed after the assembling of the components.

In the assembling of the components, the components may be assembled through welding.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
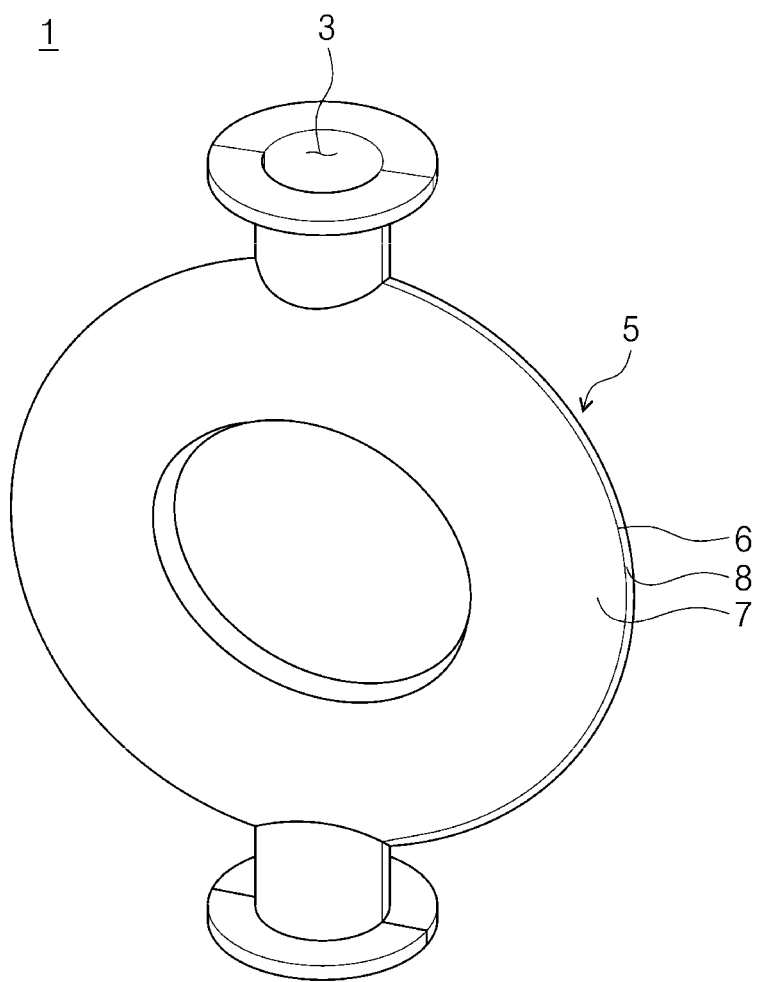
FIG. 1 is a perspective view illustrating an example of a general reactor 1.
Figure 2:
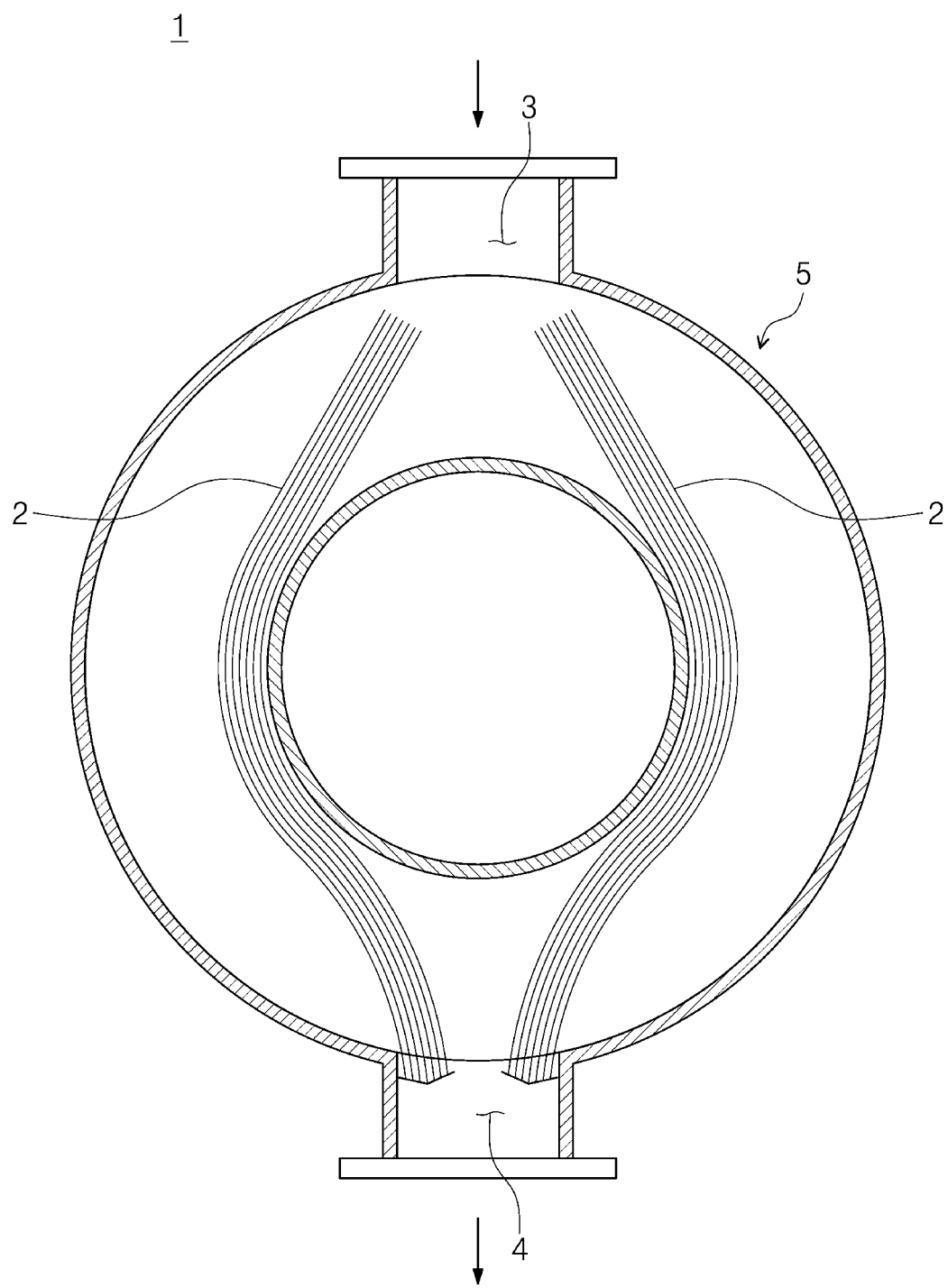
FIG. 2 is a front cross-sectional view of a reactor 1 of FIG. 1.

The inventive concept can be variously changed and various forms are possible, and specific embodiments will be illustrated in the drawings and the detailed description thereof in detail. However, the embodiments according to the concept of the inventive concept are intended to limit the specific disclosed forms, and it should be understood that the present inventive concept includes all changes, equivalents, and replacements included in the spirit and technical scope of the inventive concept.

Hereinafter, a preferred embodiment of the inventive concept will be described in detail with reference to the accompanying drawings.

Figure 3A:
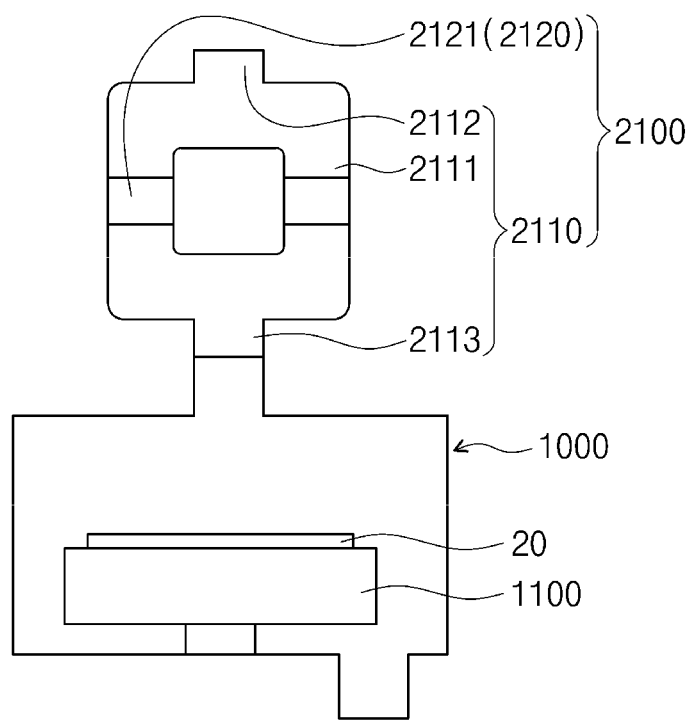
FIGS. 3A to 3C are schematic views illustrating process processing apparatuses according to embodiments of the inventive concept.
Figure 3B:
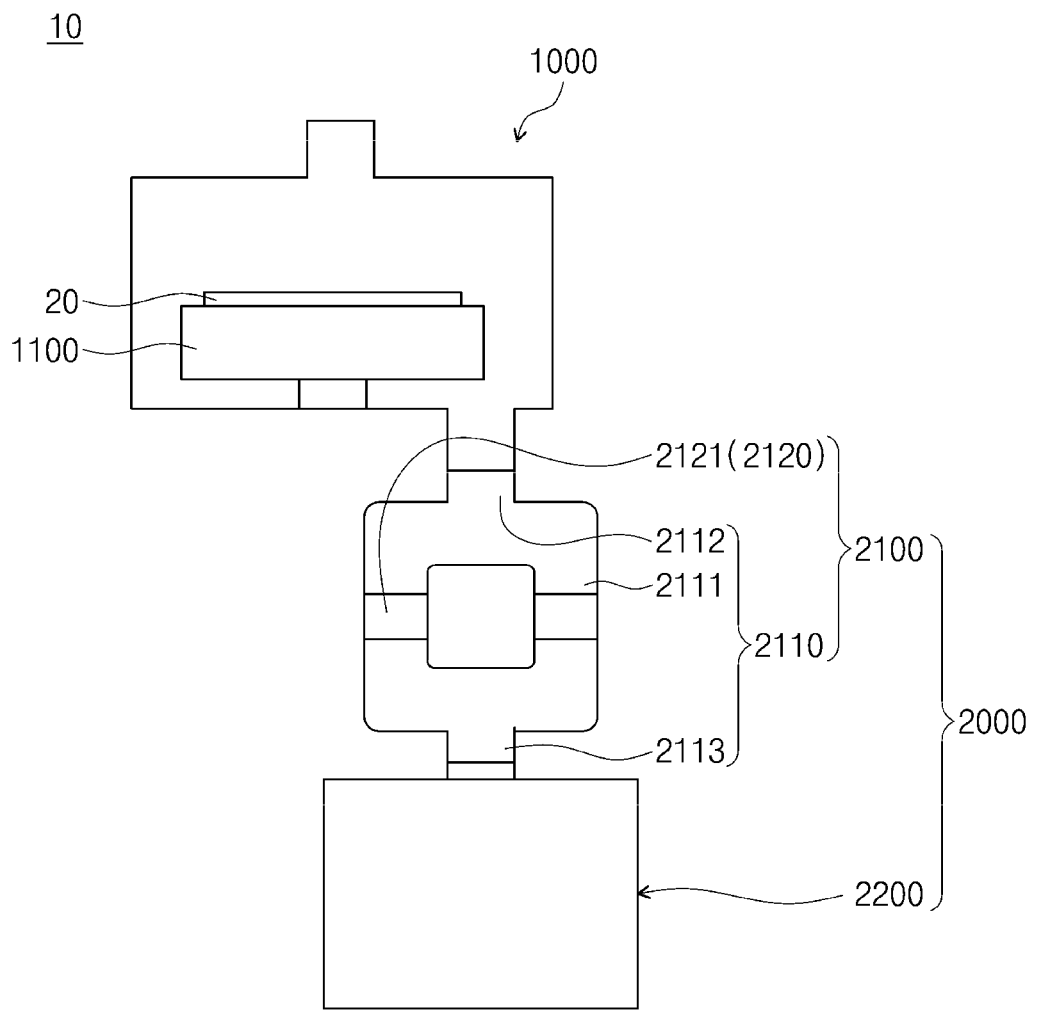
Figure 3C:
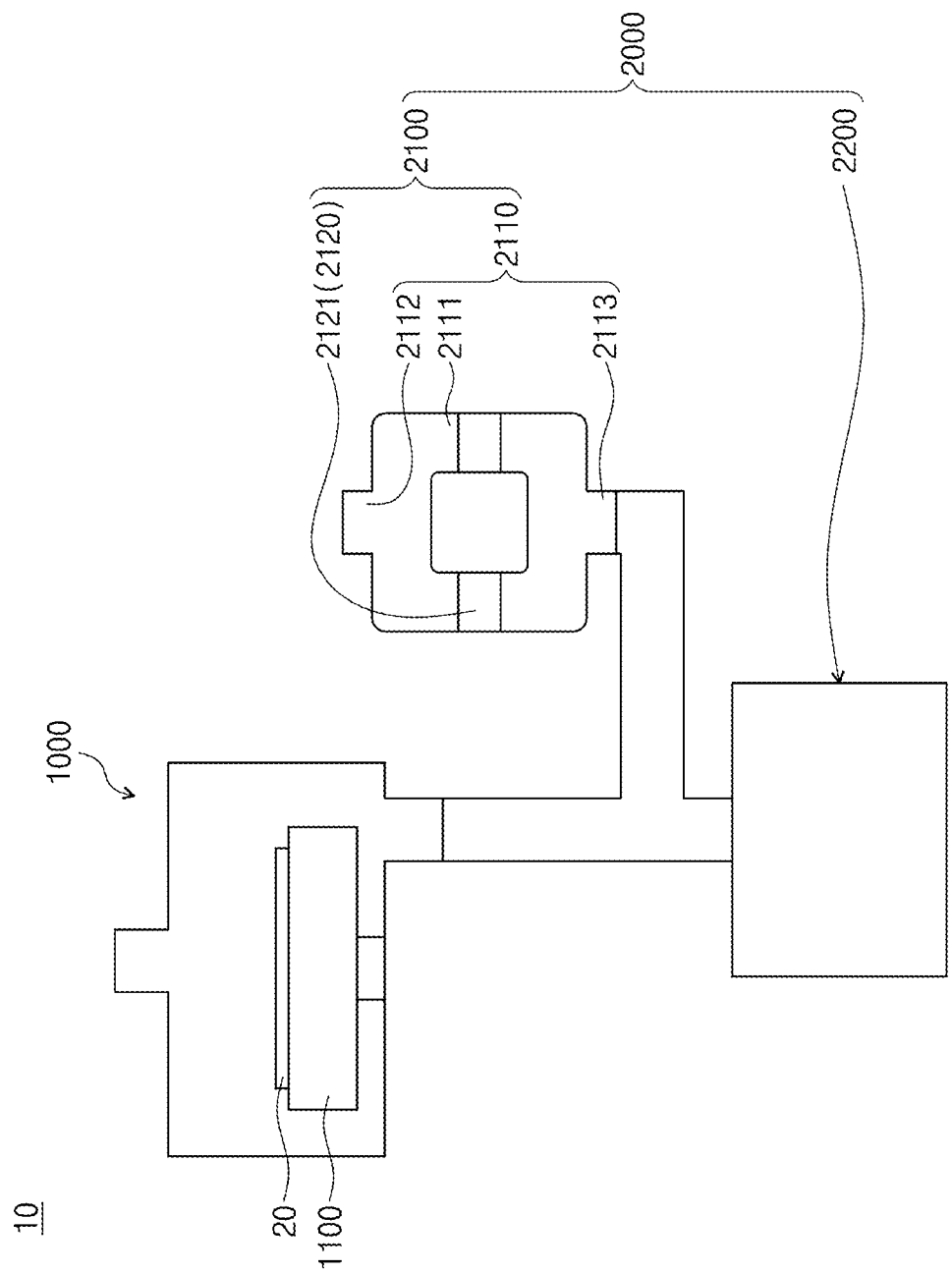

FIGS. 3A to 3C are schematic views illustrating process processing apparatuses 10 according to embodiments of the inventive concept.

FIG. 3A illustrates the process processing apparatus 10 according to an embodiment of the inventive concept, and illustrates that a plasma generating apparatus 2100 is connected in an operation before a process in a process chamber 1000.

Referring to FIG. 3A, the process processing apparatus 10 according to the embodiment of the inventive concept may include the process chamber 1000, and the plasma generating apparatus 2100 that provides plasma to the process chamber 1000.

The process chamber 1000 may include a susceptor 1100 for supporting a to-be-treated substrate 20 in an interior thereof. The substrate 20, for example, may be a silicon wafer substrate for manufacturing a semiconductor device or a glass substrate for manufacturing a liquid crystal display or a plasma display, but kinds thereof are not limited thereto.

The plasma generating apparatus 2100 is provided on one side of the process chamber 1000. An outlet pipe 2113 of the plasma generating apparatus 2100 may be connected to the process chamber 1000. Accordingly, radical components in the plasma generated by the plasma generating apparatus 2100 are supplied into the process chamber 1000. The substrate 20 may be variously treated by using radicals provided to the process chamber 1000 by the plasma generating apparatus 2100, and for example, the process may include at least one of an etching process, an ashing process, a chemical vapor deposition (CVD) process, an atomic layer deposition (ALD) process, and a plasma-enhanced chemical deposition (PECVD) process. Furthermore, the process may be a cleaning process of cleaning an interior of a process chamber in a state, in which the substrate 20 is unloaded.

According to an embodiment, the plasma treatment apparatus 2100 may include a reactor 2110, a transformer 2120, and a power supply unit (not illustrated).

A space, in which a plasma channel is formed, is formed in an interior of the reactor 2110. The plasma channel in the reactor 2110 has a limited volume, and is surrounded by the reactor 2110. The plasma channel may include a gas and/or plasma. The reactor 2110 is formed of a material having a heat-resistant property. For example, the reactor 2110 may be formed of a quartz material.

The transformer 2120 provides an induced electromotive force for generating plasma in the reactor 2110. The transformer 2120 may be installed in the reactor 2110. To achieve this, the transformer 2120 may include a core 2121. A primary winding coil may be wound on the core 2121. The core 2121 may be a ferrite core. The core 2121 of the transformer 2120 may be disposed in the reactor 2110 such that a portion of the plasma channel is interlinked.

The power supply unit supplies electric power to the winding coil. The electric power supplied by the power supply unit may be RF electric power. The power supply unit may be connected to the winding coil through wirings. The power supply unit may include an RF generator that generates RF electric power, and an RF matcher for impedance matching.

When the primary winding coil is driven, the plasma channel in the interior of the reactor 2110 function as a secondary winding to discharge the plasma in the interior of the reactor 2110.

The core 2121 may be installed in a body 2111, which will be described below.

The body 2111 may be provided with an igniter (not illustrated). The igniter is adapted for ignition to generate plasma discharging in the process gas supplied into the interior of the reactor 2110. In the inventive concept, the ignition is a process that is a cause of an initial collapse of the gas to form the plasma.

FIG. 3B illustrates a process processing apparatus 10 according to another embodiment of the inventive concept, and include the process chamber 1000, and an exhaust gas treating part 2000 that is connected to the process chamber 1000 and includes a plasma generating apparatus 2100 and a collection part 2200.

The process chamber 1000 may be an ashing chamber that removes a photoresist, may be a chemical vapor deposition (CVD) chamber that is configured to deposition an insulation film, and may be an ashing chamber for forming various insulation film structures and metal wiring structures. Furthermore, the process chamber 1000 may be a PVD chamber for depositing an insulation film, a metal film, or the like.

The plasma generating apparatus 2100 is used to burn or purify harmful substances in the exhaust gas by applying plasma energy and/or a purification gas to the exhaust gas of the process chamber (not illustrated). To achieve this, an inlet pipe 2112 of the plasma generating apparatus 2100 is connected to an outlet of the process chamber. To achieve this, the inlet pipe 2112 of the plasma generating apparatus 10 may have a size corresponding to a diameter of the outlet of the process chamber.

The collection part 2200 is connected to an opposite side of the plasma generating apparatus 2100, that is, the outlet pipe 2113 of the plasma generating apparatus 10. The outlet pipe 2113 of the plasma generating apparatus 10 may have a size corresponding to a diameter of an exhaust pipe. In the present embodiment, the sizes of the inlet pipe 2112 and the outlet pipe 2113 may have relatively large diameters such that the exhaust gas and a result substance after the reaction may easily flow.

When foreign substances in the form of particles are formed by burning or purifying harmful substances due to a reaction such as an oxidation as the exhaust gas receives plasma energy, the collection part 2200 collects the foreign substances. A discharge pump (not illustrated) that discharges the exhaust, after the foreign substances in the form of particles are collected in the collection part 2200, to an outside may be installed on one side of the collection part 2200.

The exhaust gas is generated while a process proceeds, and a kind thereof is not limited. The exhaust gas, for example, may be perfluorocompounds (PFCs).

In an embodiment of the inventive concept, a controller that controls the process chamber 1000 and/or the plasma generating apparatus 2100 may be connected to the plasma generating apparatus 2100. The controller is an element for controlling the process chamber 1000 and the plasma generating apparatus 2100 as a whole. The controller is connected to a power supply source to control electric power supplied to the plasma chamber. The control may be a control of operations of the plasma chamber and the process chamber 1000 by generating a control signal for controlling the plasma generating apparatus 2100. For example, the reactor 2110 may be provided with a measurement sensor for measuring a plasma state, and the controller controls a voltage and a current of a wireless frequency by comparing a measured value and a reference value that is a reference for a normal operation to control the power supply source.

FIG. 3C illustrates the process processing apparatus 10 according to another embodiment of the inventive concept, and illustrates that the plasma generating apparatus 2100 is connected in an operation after a process in the process chamber 1000.

Referring to FIG. 3C, the process processing apparatus 10 according to the another embodiment of the inventive concept includes the process chamber 1000, and the exhaust gas treating part 2000 that is connected to the process chamber 1000 and includes the plasma generating apparatus 2100 and the collection part 2200. Here, an exhaust pipe is connected between the process chamber 1000 and the collection part 2200, and the plasma generating apparatus 2100 is connected to the exhaust pipe.

In the present embodiment, the exhaust gas is discharged through the process chamber 1000, through the exhaust pipe, and the harmful substances of the exhaust gas are burned or purified by applying plasma energy and/or a purification gas to the exhaust gas through the plasma generating apparatus 2100. The embodiment illustrated in FIG. 3C is not significantly different from that in FIG. 3B, and is different in that the plasma source is provided in a remote control.

Although not illustrates separately in FIG. 3C, a mixing chamber, in which the exhaust gas exhausted from the process chamber 1000 and the plasma radicals supplied from the plasma apparatus 10 are mixed, may be further provided between the exhaust pipe and the plasma generating apparatus 2100. The plasma generating apparatus 2100 may form the radicals by using the plasma, and the radicals may be supplied into the mixing chamber to react with the exhaust gas exhausted from the process chamber 1000 to decompose the exhaust gas. The decomposed exhaust gas results may be decomposed into final results such as powder, and the final results may be collected by the collection part 2200.

Furthermore, as in the case of FIG. 3A, in the cases of FIGS. 3B and 3C, the plasma generating apparatus 2100 according to the embodiments of the inventive concept also may be provided as a configuration of supplying plasma radicals to the process chamber 1000.

Figure 4:
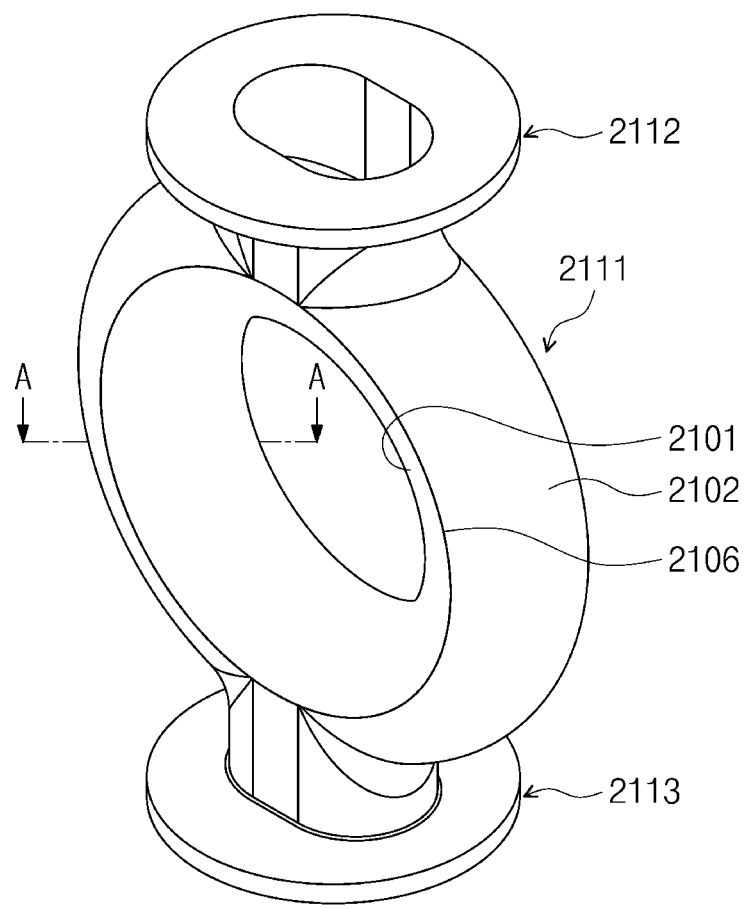
FIG. 4 is a perspective view illustrating an example of a reactor 2110 of FIGS. 3A to 3C.
Figure 5:
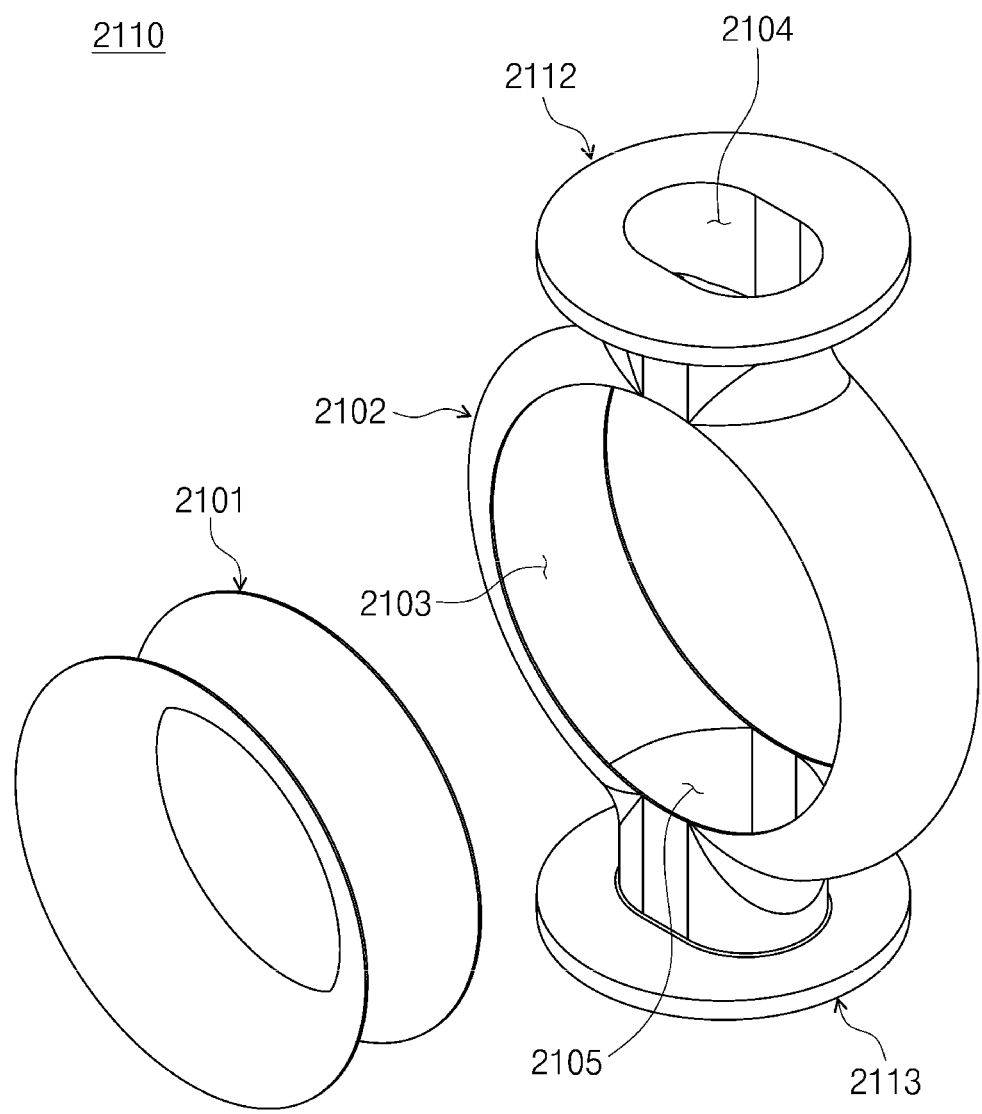
FIG. 5 is a front cross-sectional view of a reactor 2110 of FIG. 4.

FIG. 4 is a perspective view illustrating an example of the reactor 2110 of FIGS. 3A to 3C. FIG. 5 is an exploded perspective view of the reactor 2110 of FIG. 2110. Referring to FIGS. 4 and 5, the reactor 2100 may be formed by assembling a plurality of components 2101 and 2102. According to an embodiment, the reactor 2110 may include the body 2111, the inlet pipe 2112, and the outlet pipe 2113.

The reactor 2110 is a container or a part of the container that includes gas and/or plasma to ignite and/or continue the plasma.

The reactor 2110 may be completely formed of one or more insulation materials, or may be formed of both of a conductive material (for example, a metal such as aluminum, copper, nickel, and iron, or a coated metal such as anodized aluminum or nickel-coated aluminum), and an insulation material (for example, quartz, sapphire, alumina, an aluminum nitride, or a ceramic material).

When the reactor 2110 is formed of only an insulation material, an electrical continuity around the reactor 2110 is destructed whereby at least one insulation zone, from which a portion of the reactor is electrically isolated, may not be included.

In some embodiments of the inventive concept, the reactor 2110 may not only help cooling of an insulation material but also may be surrounded by a cooling jacket that functions as a primary winding, and electric fields and currents arranged in the channel may be induced by a magnetic core coupled to the primary coil of the transformer. The plasma in the channel of the reactor 2110 finishes the secondary circuit of the transformer 2120.

Here, the channel may have a limited volume, and is surrounded by the reactor 2110. The channel may include a gas and/or plasma, and a space, in which the channel is provided, may be connected to one or more inlet pipes and one or more outlet pipes of the reactor to receive or feed gas species and plasma species.

Furthermore, the reactor 2110 may provide toroid-shaped plasma, and may have a circular doughnut shape having a square cross-section. Another reactor 2110 that provides toroid-shaped plasma has various shapes. The shape, for example, may include any one of all following shapes. That is, the shape of the reactor may have an elliptical doughnut shape, a square doughnut shape, and a polygonal doughnut shape, and for example, may have a circular cross-section or an elliptical cross-section.

The body 2111 is provided with a plasma forming space 2103, in which the plasma is formed. The body 2111 has an inlet 2104 and an outlet 2105. The gas is introduced into the plasma forming space 2103 through the inlet 2104. Through the outlet 2105, the fluid in the plasma forming space 2103 is discharged to the outside. According to an embodiment, a source gas or an exhaust gas introduced through the inlet 2104 may be converted into plasma in the plasma forming space 2103, and the plasma formed in the plasma forming space 2103 is discharged though the outlet 2105. The inlet pipe 2112, through which the source gas or the exhaust gas is supplied, may be connected to the inlet 2104, and the outlet pipe 2113 connected to the process chamber or the collection part may be connected to the outlet 2105.

The plasma forming space 2103 is a layer that endures erosion due to strong ions or active neutral species, and an interior of the plasma forming space 2103 may be coated. The internal coating may provide a low recoupling rate of plasma substances. For example, a silicon nitride, a silicon dioxide, an aluminum oxide, an aluminum nitride, diamond, and a polymer material may be applied as a material for the internal coating.

An assembly line 2106 for the components 2101 and 2102 is formed in an area that deviates from an area that is closest to an area of the plasma forming space 2103 of the body 2111, in which plasma is concentrated, by a specific range. The area of the plasma forming space 2103, in which the plasma is concentrated, refers to an area that has a relatively high density of the plasma as compared with the other areas of the plasma forming space 2103. The area of the plasma forming space 2103, in which the plasma is concentrated, may be predicted through a simulation or may be measured through an observation during an experiment or performance of a process.

According to an embodiment, the body 2111 may have a toroid shape. In this case, the assembly line 2106 may be formed in an area that deviates from an inner line obtained by connecting locations that are closest to a central portion to the toroid shape according to a direction, in which the central portion of the toroid shape of the body 2111 is surrounded, by a specific range. For example, when the body 2111 has the toroid shape, the components may include an inner ring component 2101 and an outer ring component 2102.

The inner ring component 2101 may be a component corresponding to an area including the inner line of the reactor 2110. For example, the inner ring component 2101 may correspond to an area that extends from the inner line of the body 2111 to opposite sides along a circumferential direction thereof. Accordingly, as illustrated in FIGS. 4 and 5, when the reactor 2110 has a toroid shape, the inner ring component 2101 may have a ring shape corresponding to an inner area of the reactor 2110.

The outer ring component 2102 may be a component corresponding to an area including an outer side of the inner ring component 2101 of the reactor 2110. According to an embodiment, the inlet pipe 2112 and the outlet pipe 2113 may be integrally formed with the outer ring component 2102. Accordingly, as illustrated in FIGS. 4 and 5, when the reactor 2110 has the toroid shape, the outer ring component 2102 may have a ring shape corresponding to an outer area of the reactor 2110.

Figure 6:
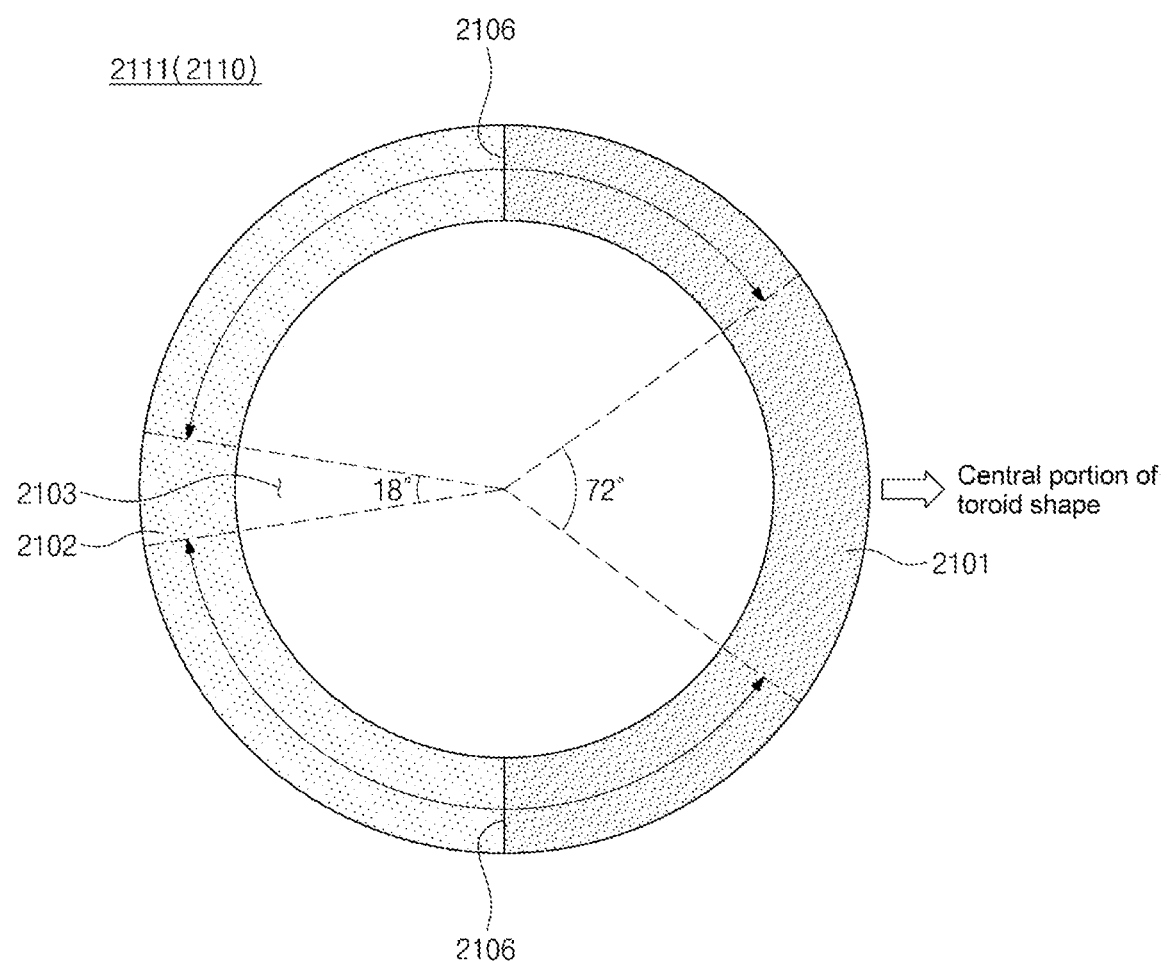
FIG. 6 is a cross-sectional view of a reactor 2110 of FIG. 4, viewed in direction AA.

FIG. 6 is a cross-sectional view of the reactor 2110 of FIG. 4, viewed in direction AA. Referring to FIG. 6, according to an embodiment, when the body 2111 has the toroid shape, the inner ring component 2101 may be provided in a range of 20% to 95% of the body with respect to a cross-section obtained by cutting an area, except for an area, in which the inlet 2104 and the outlet 2105 of the body 2111 are formed, in a direction that is perpendicular to a direction, and the outer ring component 2102 may occupy the other ranges. Then, the assembly line 2106 is located to deviate from an end area of the body 2111, which faces the central portion of the toroid shape. For example, the inner ring component 2101 preferably occupies an area of 50% of the body 2111 with respect to a cross-section obtained by cutting the central portion of the toroid shape in the direction that is perpendicular to the direction, in which the central portion of the toroid is surrounded, and the assembly line 2106 may be formed at locations that are spaced apart from an end of the toroid shape, which faces the central portion of the toroid shape, to opposite sides, by 90 degrees.

In this way, because the plasma loop tends to be inclined to an area of the interior of the reactor 2110, which is adjacent to the central portion of the toroid shape, according to a property of the plasma of moving in a shortest path from the inlet 2104 to the outlet 2105 when the body 2111 has the toroid shape, the assembly line 2106 of the components 2101 and 2102 may deviate from an area having a relatively high density of the plasma by constituting the components 2101 and 2102 that form the reactor 2110. Accordingly, an amount of particles that may be generated in the assembly line 2106 through the plasma reaction may be minimized.

Figure 7:
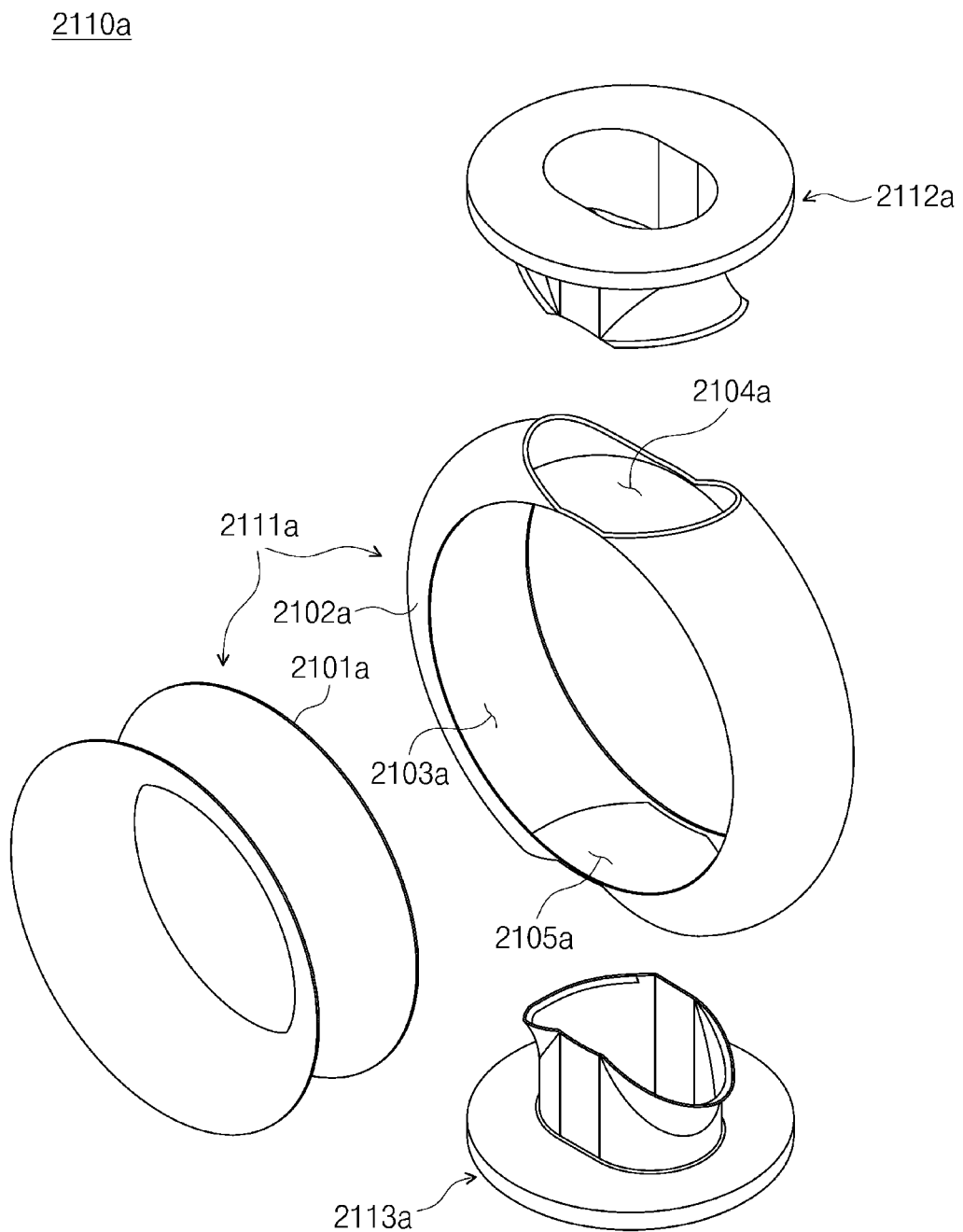
FIG. 7 is an exploded perspective view illustrating another example 2110a of a reactor of FIGS. 3A to 3C.

FIG. 7 is an exploded perspective view illustrating another example 2110a of a reactor of FIGS. 3A to 3C.

Referring to FIG. 7, an inlet pipe 2112a and an outlet pipe 2113a may be manufactured as separate components and be assembled in a body 2111a. For example, the inlet pipe 2112a may be assembled in an area that surrounds an inlet 2104a of the body 2111a. Furthermore, the outlet pipe 2113a may be assembled in an area that surrounds an outlet 2105a of the body 2111a.

The other configurations, structures, and functions of the reactor 2110a according to the present embodiment may be the same as or similar to those of the reactor 2110 of FIG. 4. Accordingly, the assembly line of the components 2101a, 2102a, 2112a, and 2113a of the reactor 2110a also may deviate from an area that is adjacent to the central portion of the toroid shape, which has a relatively high density of the plasma.

Figure 8:
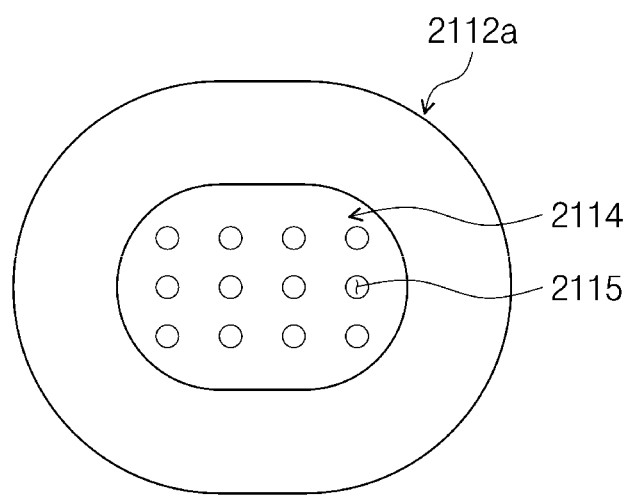
FIG. 8 is a plan view illustrating an example of an inlet pipe 2112a of FIG. 7.

FIG. 8 is a plan view illustrating an example of the inlet pipe 2112a of FIG. 7.

Referring to FIG. 8, the inlet pipe 2112a may further include a distribution member 2114. The distribution member 2114 also may be provided to the outlet pipe 2113a. However, only a case, in which the distribution member 2114 is provided to the inlet pipe 2112a, will be discussed here for convenience' sake.

The distribution member 2114 distributes the gas introduced through the inlet pipe 2112a. According to an embodiment, the distribution member 2114 may be provided to block an interior of the inlet pipe 2112a, and may have a plate shape having a plurality of distribution holes 2115 that pass through an upper surface and a bottom surface thereof. The distribution holes 2115 may be distributed uniformly over an entire area of the distribution member 2114, or may be unevenly distributed according to necessities.

According to the present embodiment, the distribution member 2114 may be integrally formed with the inlet pipe 2112a. That is, the distribution member 2114 and the inlet pipe 2112a may be machined and manufactured while being integrally maintained with one raw material. Unlike this, the distribution member 2114 may be assembled in the interior of the inlet pipe 2112a after being manufactured separately from the inlet pipe 2112a through machining. The distribution member 2114 may be assembled in the inlet pipe 2112a though a welding scheme that is the same as the welding scheme used in assembling other components of the reactor 2110a. Unlike this, selectively, the distribution member 2114 may not be provided to the reactor 2110a. That is, the inlet pipe 2112a or the outlet pipe 2113a may be in a completely opened state, in which the distribution member 2114 is not provided.

Figure 9:
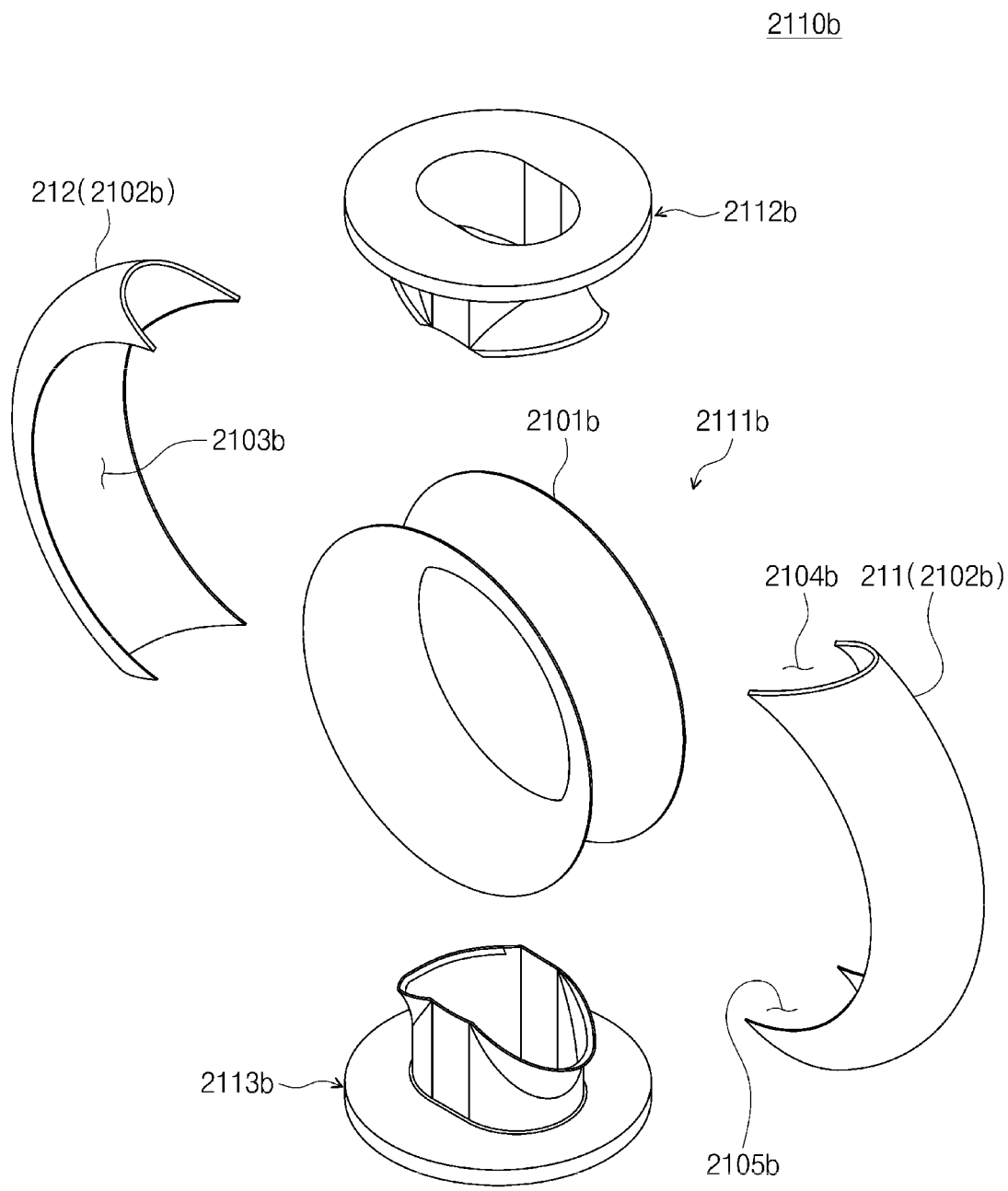
FIG. 9 is an exploded perspective view illustrating another example 2110b of a reactor of FIGS. 3A to 3C.

FIG. 9 is an exploded perspective view illustrating another example 2110b of a reactor of FIGS. 3A to 3C.

Referring to FIG. 9, the outer ring component 2102b may include a plurality of outer components 211 and 212. According to an embodiment, the outer components 211 and 212 may be assembled to form the outer ring component 2102b. For example, the outer ring component 2102b may include the outer component 211 corresponding to one side of an inlet 2104b and an outlet 2105b, and the outer component 212 corresponding to an opposite side thereof. Unlike this, the number of the outer components that constitute the outer ring component 2102b and areas occupied by the outer components may be variously determined according to a raw material and a machining condition.

The other configurations, structures, and functions of the reactor 2110b according to the present embodiment may be the same as or similar to those of the reactor 2110a of FIG. 7. Accordingly, the assembly line of the components 2101b, 211, 212, 2112b, and 2113b of the reactor 2110b also may deviate from an area that is adjacent to the central portion of the toroid shape, which has a relatively high density of the plasma.

Figure 10:
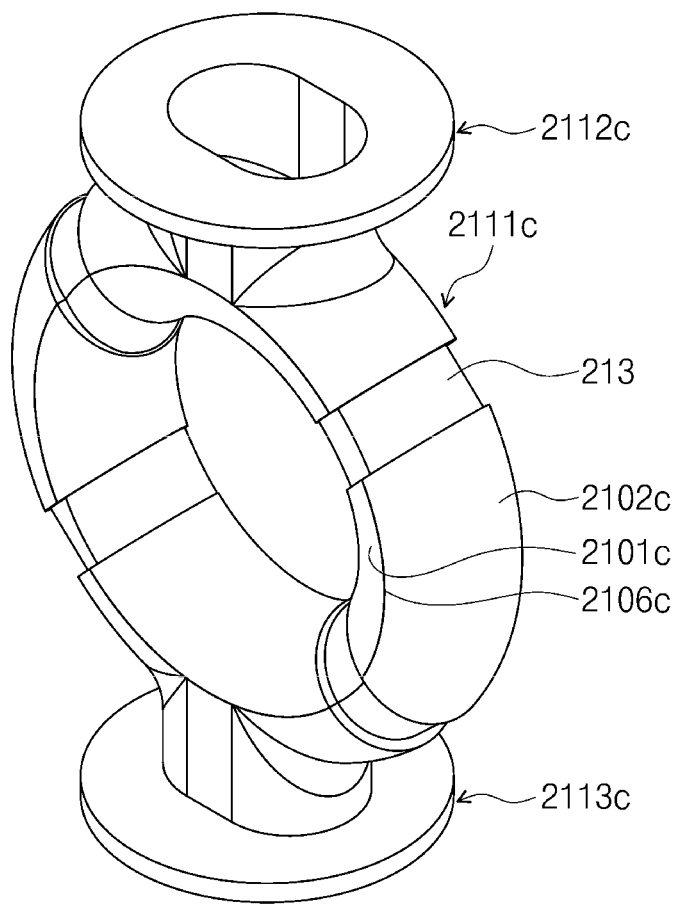
FIG. 10 is an perspective view illustrating another example 2110c of a reactor of FIGS. 3A to 3C.

FIG. 10 is a perspective view illustrating another example 2110c of a reactor of FIGS. 3A to 3C.

Referring to FIG. 10, a core coupling recess 213 may be formed on an outer surface of the reactor 2110c. A core (2121 of FIGS. 3A to 3C) of a transformer (2120 of FIGS. 3A to 3C) is coupled to the core coupling recess 213. The core coupling recess 213 may be formed on the outer surface of a body 2111c to be recessed inwards. According to an embodiment, when a plurality of cores (2121 of FIGS. 3A to 3c) may be installed in the body 2111c to be spaced apart from each other along a direction, in which the central portion of the toroid shape is surrounded, when a front surface of the reactor 2110c is viewed. For example, the cores 2121 may be installed on a right upper side, a left upper side, a right lower side, and a left lower side of the body 2111c, respectively, to be interlinked when the reactor 2110c is viewed from the front side. Accordingly, the core coupling recesses 213 also may have a structure that is recessed inwards along a direction, in which the body 2111c is interlinked, may be provided at a location, at which the core 2121 of the outer surface of the body 2111c is installed, such that inner surfaces of the cores 2121 may be engaged with the core coupling recesses 213. As described above, the cores 2121 may be coupled to the reactor 2110c more stably as the cores 2121 are engaged with the core coupling recesses 213.

The other configurations, structures, and functions of the reactor 2110c according to the present embodiment may be the same as or similar to those of the reactor 2110, 2110a, and 2110b of FIGS. 4, 7, and 9. Accordingly, the assembly line of the components of the reactor 2110c also may deviate from an area that is adjacent to the central portion of the toroid shape, which has a relatively high density of the plasma.

Figure 11:
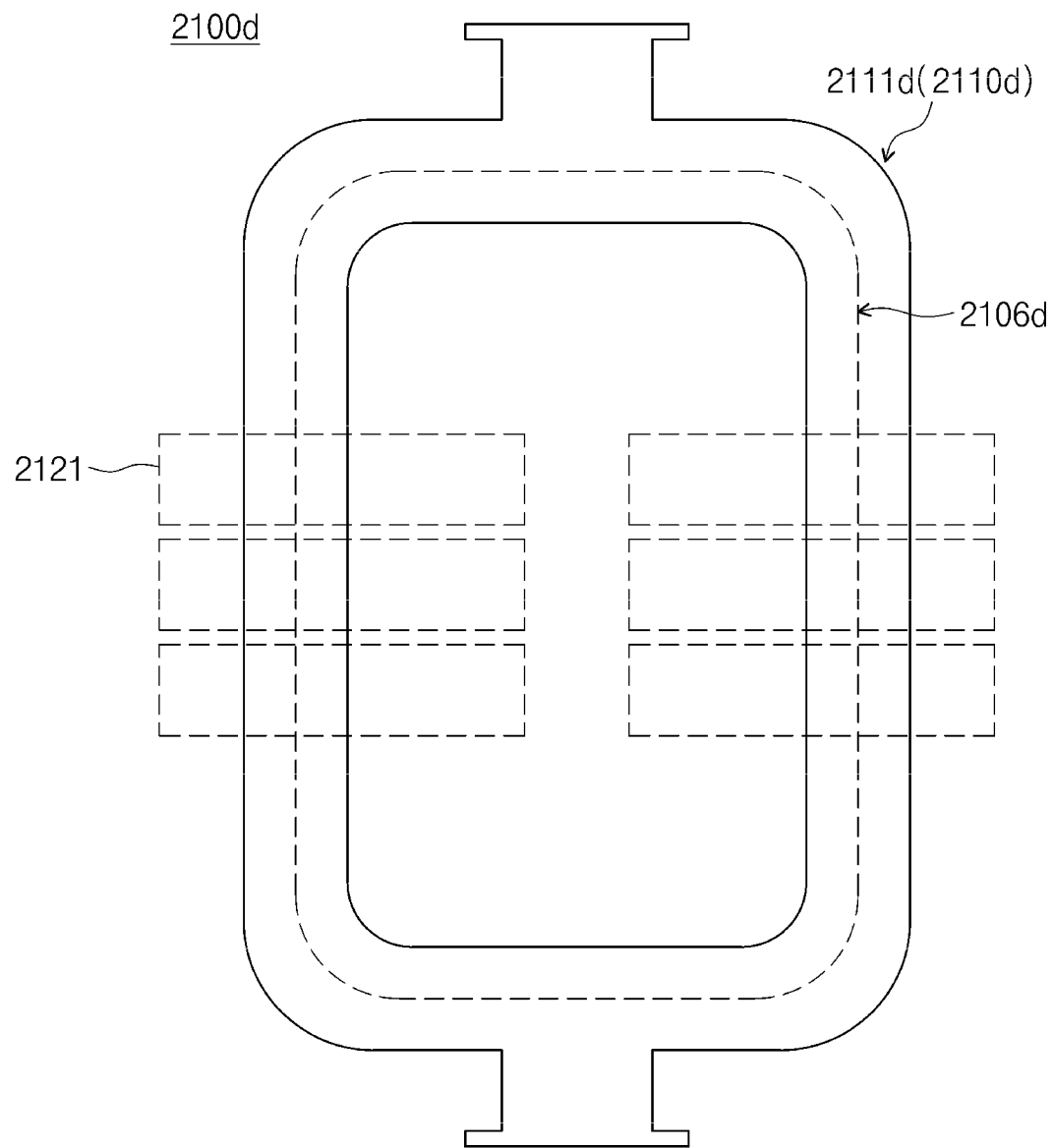
FIGS. 11, 12A, and 12B are front views schematically illustrating other examples 2100d, 2100e, and 2100i of the plasma treatment apparatuses of FIGS. 3A to 3C.
Figure 12A:
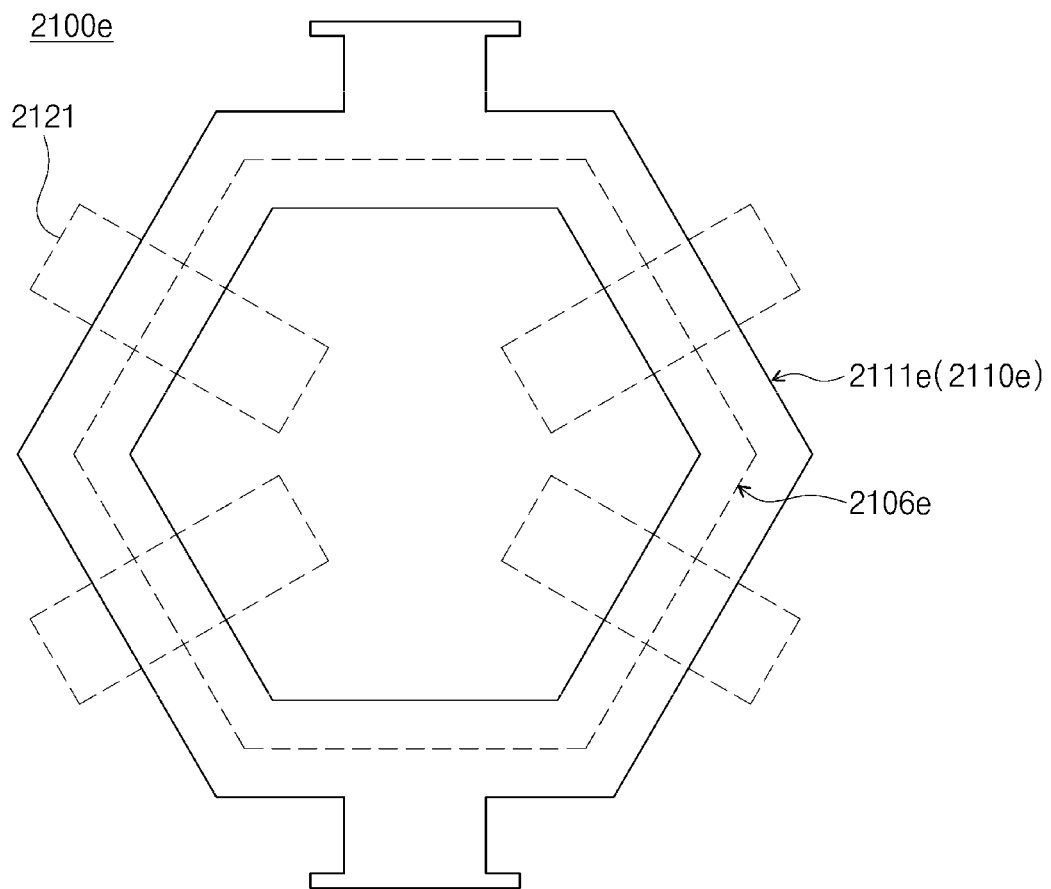
Figure 12B:
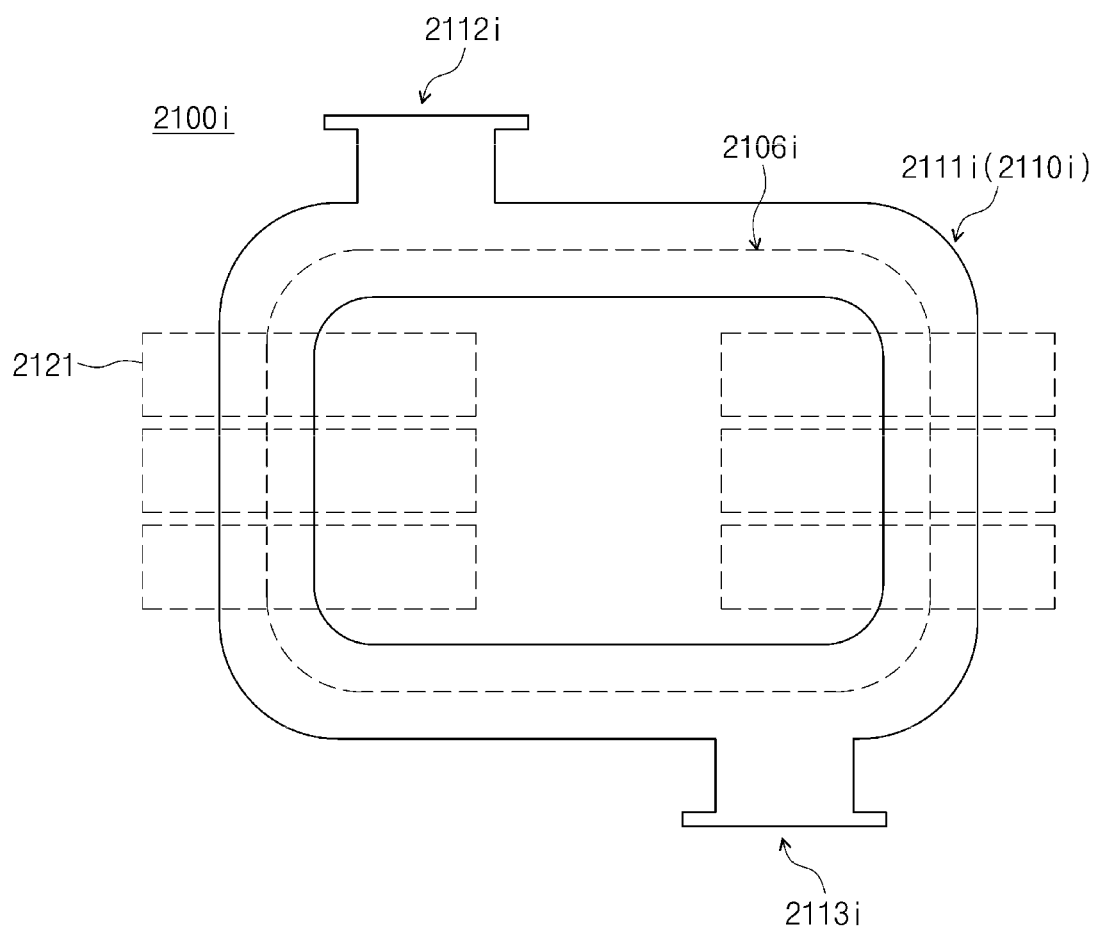

FIGS. 11, 12A, and 12B are front views schematically illustrating other examples 2100d, 2100e, and 2100i of the plasma treatment apparatuses of FIGS. 3A to 3C.

Referring to FIGS. 11 and 12a, the reactor 2110d and 2110e may have various shapes according to necessities. For example, as illustrated in FIG. 11, a body 2111d of the reactor 2110d may have a rectangular toroid shape. In this case, the body 2111d may have a rectangular toroid shape, a transverse direction of which is longer as in FIG. 11, or may have a rectangular toroid shape, a longitudinal direction of which is longer as in FIG. 12B. Unlike this, as illustrated in FIG. 12A, a body 2111e of the reactor 2110e may have a hexagonal toroid shape. Furthermore, in addition, the reactor may have various shapes, for example, an elliptical toroid shape, a longitudinal direction of which is longer than a transverse direction thereof or an elliptical toroid shape, a transverse direction of which is longer than a longitudinal direction thereof.

Furthermore, selectively, the cores 2121 may be installed at various locations of the body 2111d and 2111e according to the shapes of the bodies 2111d and 2111e of the reactors 2110d and 2110e. For example, as illustrated in FIG. 11, when the reactor 2110d has a polygonal toroid shape, a plurality of cores may be arranged in a row along edges of the polygonal shape in an area corresponding to one edge other than edges of the polygonal shape, to which the inlet pipe or the outlet pipe is connected, and an area corresponding to another edge. Unlike this, as illustrated in FIG. 12A, when the reactor 2110e has a polygonal toroid shape, the cores 2121 may be installed at some or all of the edges other than the edges of the polygonal shape, to which the inlet pipe or the outlet pipe is connected, respectively.

The core coupling recesses 213 formed in the bodies 2111d and 2111e of the reactors 2110d and 2110e also may be formed at different locations according to the locations of the cores 2121 according to necessities. Unlike this, the core coupling recess 213 is not formed as illustrated in the drawings, and the core 2121 may be coupled to the reactors 2110d and 2110e by other structures or configurations.

Referring to FIG. 12B, unlike the above-described embodiments, in which the inlet pipe and the outlet pipe are arranged along an imaginary vertical line that is a reference for dividing the body of the toroid shape such that opposite sides of the body are line-symmetrical to each other, in the reactor 2110i according to the present embodiment, an inlet pipe 2112i and an outlet pipe 2113i may be provided to be located at locations that deviate from an imaginary vertical line that is a reference for dividing a body 2111i such that the opposite sides of the body 2111i are line-symmetrical to each other. For example, the inlet pipe 2112i and the outlet pipe 2113i may be provided to be inclined in opposite directions from an imaginary vertical line that is a reference for dividing the body 2111i such that the opposite sides of the body 2111i are line-symmetrical to each other.

The other configurations, structures, and functions of the reactors 2110d, 2110e, and 2110i according to the present embodiments may be the same as or similar to those of the reactor 2110c of FIG. 10. Accordingly, the assembly line of the components of the reactors 2110d, 2110e, and 2110i also may deviate from an area that is adjacent to the central portion of the toroid shape, which has a relatively high density of the plasma.

Figure 13:
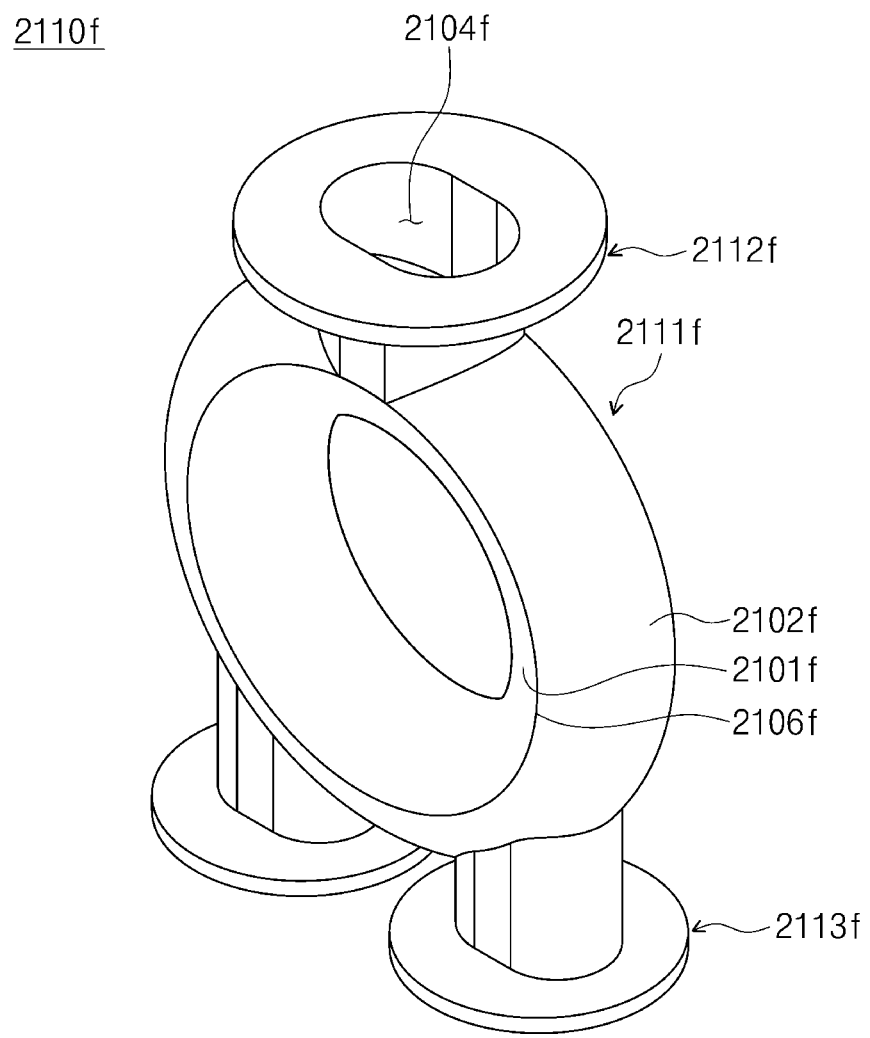
FIG. 13 is a perspective view illustrating another example 2110f of a reactor of FIGS. 3A to 3C.

FIG. 13 is a perspective view illustrating another example 2110f of a reactor of FIGS. 3A to 3C.

Referring to FIG. 13, a plurality of inlets 2104f and/or a plurality of outlets 2105f may be provided in one body 2111f When the plurality of inlets 2104f and the plurality of outlets 2105f are provided, a plurality of inlet pipes 2112f and/or a plurality of outlet pipes 2113f may be provided in correspondence. Although FIG. 13 illustrates the reactor 2110f provided with one inlet 2104f and two outlets 2105f, the reactor 2110f may be provided selectively with a plurality of inlets 2104f and one outlet 2105f or a plurality of inlets 2104f and a plurality of outlets 2105f according to necessities. The inlet pipes 2112f may be connected to different apparatuses or may be connected to branched pipes of the same apparatus according to necessities. Furthermore, the outlet pipes 2113f may be connected to different apparatuses or may be connected to branched pipes of the same apparatus according to necessities.

The other configurations, structures, and functions of the reactor 2110f according to the present embodiment may be the same as or similar to those of the reactor 2110, 2110a, 2110b, and 2110c of FIGS. 3A to 3C, 7, 9, and 10. Accordingly, an assembly line 2106f of the components of the reactor 2110f also may deviate from an area that is adjacent to the central portion of the toroid shape, which has a relatively high density of the plasma.

Figure 14:
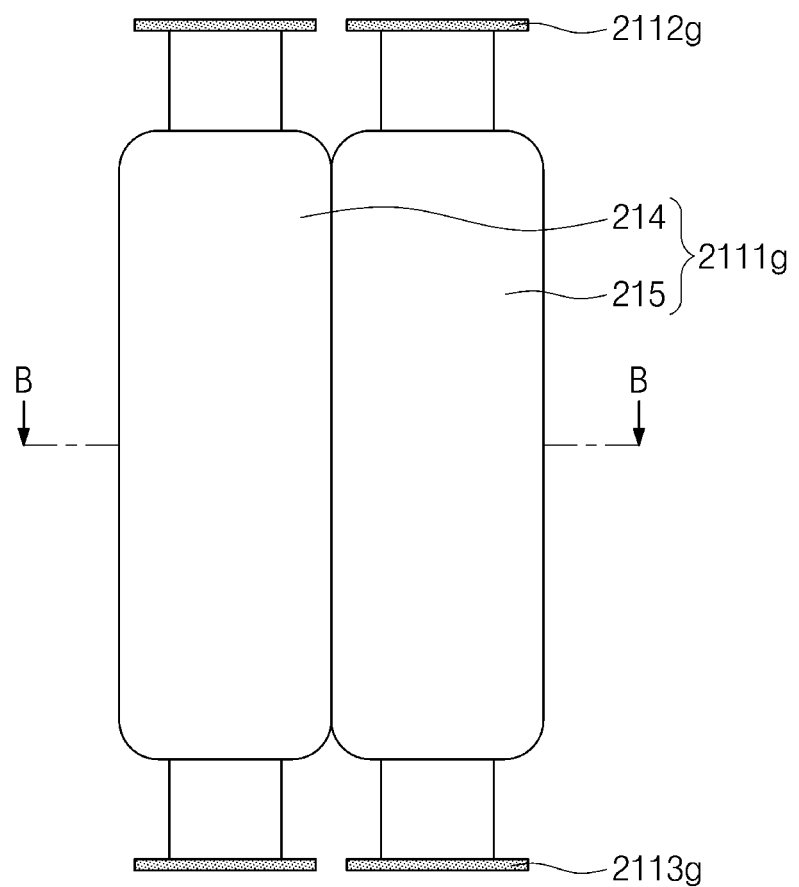
FIG. 14 is a perspective view illustrating another example 2110g of a reactor of FIGS. 3A to 3C.
Figure 15:
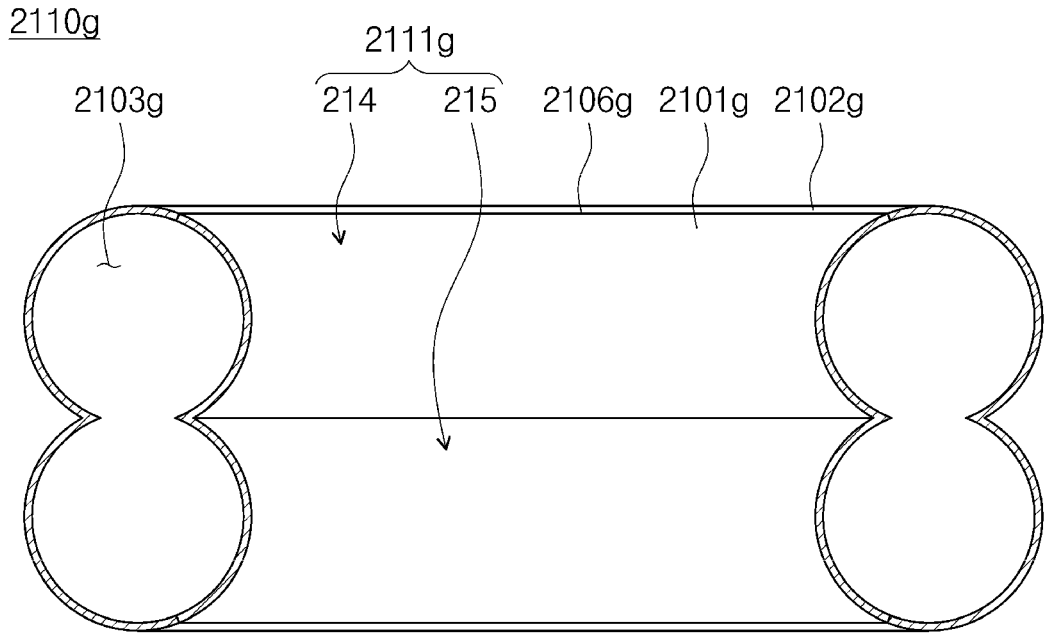
FIG. 15 is a cross-sectional view of a reactor 2110g of FIG. 14, when viewed in direction BB.

FIG. 14 is a perspective view illustrating another example 2110g of a reactor of FIGS. 3A to 3C. FIG. 15 is a cross-sectional view of a reactor 2110g of FIG. 14, when viewed in direction BB.

Referring to FIGS. 14 and 15, a body 2111g may include sub-bodies 214 and 215. According to an embodiment, the sub-bodies 214 and 215 may have a toroid shape. Then, the central portions of the toroid shapes of the sub-bodies 214 and 215 are arranged along an imaginary straight line, and a direction, in which the central portions of the toroid shapes of the sub-bodies 214 and 215 are surrounded, may be perpendicular to the straight line. In this case, as in the above-described embodiments, an assembly line 2106g also is formed in an area that deviates from an inner line that is closest to the central portions of the toroid shapes of the sub-bodies 214 and 215 by a specific range.

For example, the reactor 2110g of FIGS. 14 and 15 may be formed by combining an inner ring component 2101g and an outer ring component 2102g similarly to the reactor 2110 of FIG. 4, and an inlet pipe 2112g and an outlet pipe 2113g may be integrally formed with the outer ring component 2102g.

Unlike this, the body 2111g of the reactor 2110g of FIGS. 14 and 15 may be formed by combining an inner ring component 2101g and an outer ring component 2102g similarly to the reactor 2110a of FIG. 7, and the inlet pipe 2112g and the outlet pipe 2113g may be assembled in the body 2111g after being manufactured separately.

Unlike this, the reactor 2110g of FIGS. 14 and 15 may be formed by combining a plurality of outer components, of which the outer ring components 2102g are separately manufactured, similarly to the reactor 2110b of FIG. 9.

Accordingly, the assembly line 2106g of the components of the reactor 2110g also may deviate from an area that is adjacent to the central portion of the toroid shape, which has a relatively high density of the plasma.

According to the present embodiment, the inlet pipe 2112g and the outlet pipe 2113g may be connected to the inlet and the outlet formed for the sub-bodies 214 and 215, respectively. The inlet pipes 2112g may be connected to different apparatuses or may be connected to branched pipes of the same apparatus according to necessities. Furthermore, the outlet pipes 2113g may be connected to different apparatuses or may be connected to branched pipes of the same apparatus according to necessities. As illustrated in FIG. 15, surfaces of the sub-bodies 214 and 215, which face each other, may be opened such that a plasma forming spaces 2103g are communicated with each other.

Figure 16:
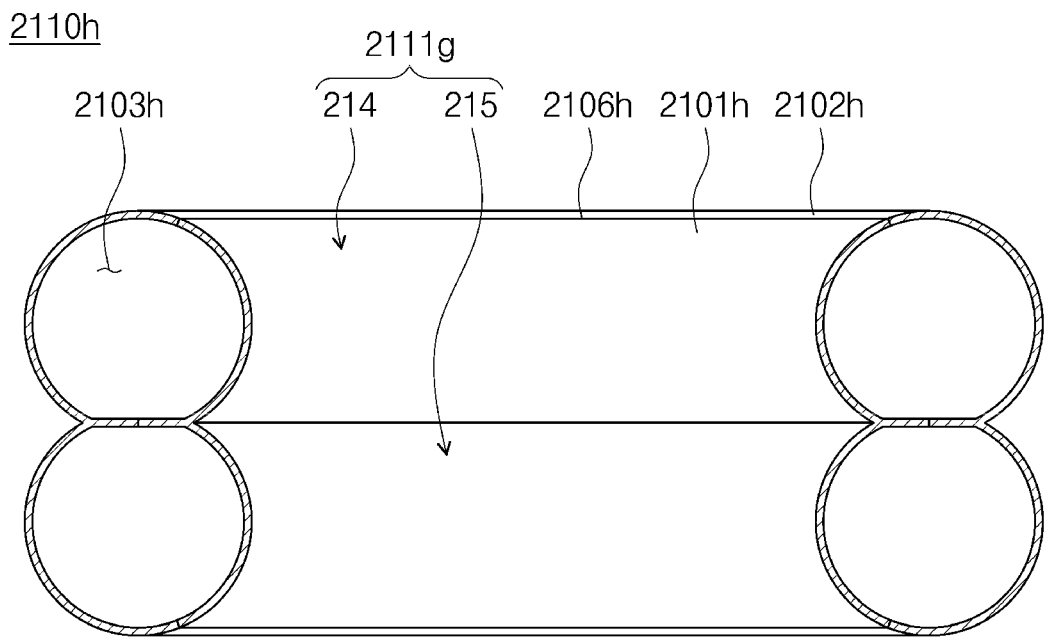
FIG. 16 is a cross-sectional view illustrating another example 2110h of a reactor of FIGS. 3A to 3C, when viewed in the same direction as that of FIG. 15.

FIG. 16 is a cross-sectional view illustrating another example 2110h of a reactor of FIGS. 3A to 3C, when viewed in the same direction as that of FIG. 15. Referring to FIG. 16, unlike the reactor 2110g of FIG. 15, a reactor 2110h may be configured such that plasma forming spaces 2103h therein are separated by facing surfaces.

The other configurations, structures, and functions of the reactor 2110h according to the present embodiment may be the same as or similar to those of the reactor 2110g of FIG.

14. Accordingly, an assembly line 2106h of the components of the reactor 2110h also may deviate from an area that is adjacent to the central portion of the toroid shape, which has a relatively high density of the plasma.

Hereinafter, a method for manufacturing a reactor according to an embodiment of the inventive concept will be described. The method for manufacturing the reactor according to the embodiment of the inventive concept is a method for manufacturing a reactor that is formed by assembling a plurality of components. Although it has been mainly described in the specification that the reactor 2110 of FIG. 4 is manufactured, the method for manufacturing the reactor according to the present embodiment may be applied to all the reactors 2110, 2110a, 2110b, 2110c, 2110d, 2110e, 2110f, 2110g, and 2110h.

Figure 17:
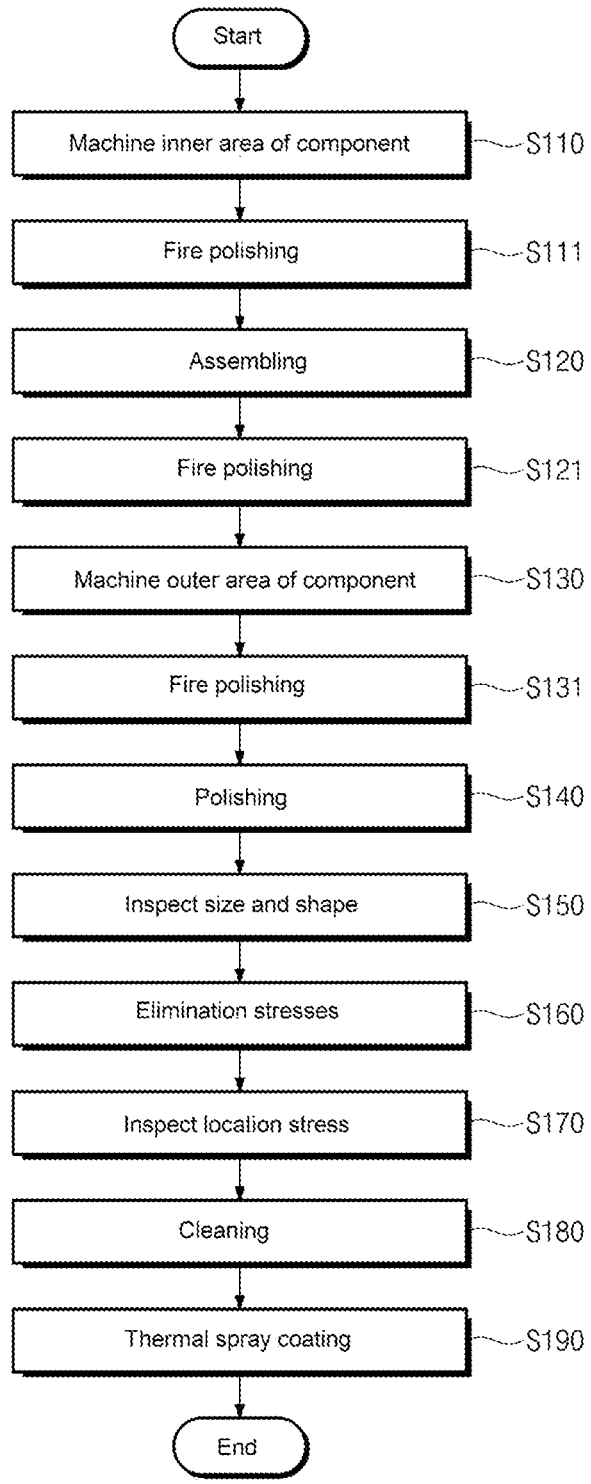
FIG. 17 is a flowchart of a method for manufacturing a reactor according to an embodiment of the inventive concept.

FIG. 17 is a flowchart of a method for manufacturing a reactor according to an embodiment of the inventive concept.

Referring to FIG. 17, the method for manufacturing the reactor may include component forming operations S110 and S130, an assembling operation S120, a polishing operation S140, a size and shape inspecting operation S150, a stress eliminating operation S160, a local stress inspecting operation S170, a cleaning operation S180, and a thermal spray coating operation S190.

Figure 18:
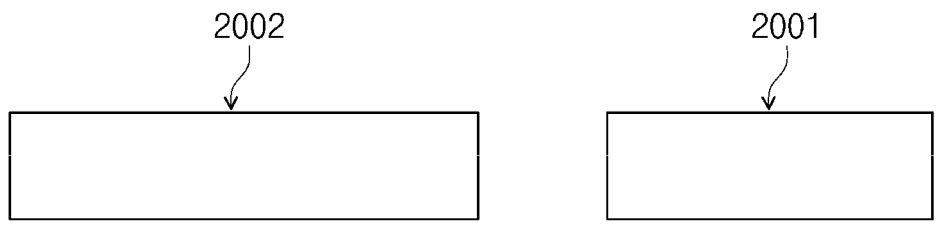
FIG. 18 is a view schematically illustrating an example of a raw material before machining in a component forming operation of FIG. 17.

FIG. 18 is a view schematically illustrating an example of raw material 2001 and 2002 before machining in the component forming operations S110 and S130 of FIG. 17. Referring to FIGS. 4, 17, and 18, in the component forming operations S110 and S130, the components 2101 and 2102 that constitute the reactor 2110 are formed to have shapes of corresponding areas of the reactor 2110 by machining the raw materials 2001 and 2002. For example, in the component forming operations S110 and S130, the raw materials 2001 and 2002 may be machined through a polishing process.

According to an embodiment, the raw materials corresponding to the components 2101 and 2102 may be provided separately. The raw materials 2001 and 2002 may have plate shapes having suitable thicknesses and widths to be machined to the shapes of the corresponding components 2101 and 2102. For example, the raw material 2001 corresponding to the inner ring component 2101 may have a plate shape having a thickness and a width that are suitable for machining of the inner ring component 2101, and the raw material 2002 corresponding to the outer ring component 2102 may have a plate shape having a thickness and a width that are suitable for machining of the outer ring component 2102, in which the inlet pipe 2112 and the outlet pipe 2113 are integrally formed. Unlike this, when the reactor according to the other embodiments than the reactor 2110 of FIG. 4 is manufactured by using the method for manufacturing the reactor according to the present embodiment, the raw materials of the plate shapes having the thicknesses and widths corresponding to the components that constitute the reactor may be provided.

The raw materials 2001 and 2002 may be formed of a material having a heat-resistant property. For example, the raw materials 2001 and 2002 may be formed of a quartz material. The component forming operations S110 and S130 may include an inner area machining operation S110 and an outer area machining operation S130.

Figure 19:
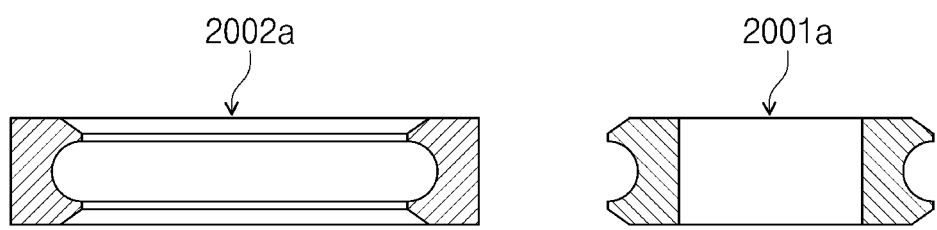
FIG. 19 is a cross-sectional view illustrating an example of a raw material, on which an inner area machining operation of FIG. 17 has been performed.

FIG. 19 is a cross-sectional view illustrating an example of raw material 2001a and 2002a, on which the inner area machining operation S110 of FIG. 17 has been performed.

Referring to FIGS. 4, 17, and 19, the inner area machining operation S110 may be performed before the assembling operation S120. In the inner area machining operation S110, areas of the raw materials 2001 and 2002 corresponding to the inner surface of the reactor 2110 are machined. Then, outer corners of border surfaces of the raw materials 2001 and 2002, which contact the other components to form assembly lines 2106, may be machined such that they are inclined in a direction that is opposite to a direction, which the border surfaces face, as they go outwards. Accordingly, in the assembling operation S120, which will be described below, a welding operation may be performed more easily along a groove formed by the border surfaces of the facing components.

According to an embodiment, in the inner area machining operation S110, the raw material 2001 machined to the inner ring component 2101 may correspond to the inner ring component 2101, and an outer peripheral surface thereof may be grinded to a ring shape that is recessed concavely to form a portion of the plasma forming space 2103. According to the present embodiment, an area corresponding to the central portion of the toroid shape of the raw material 2001 machined to the inner ring component 2101 may be grinded such that opposite surfaces thereof are passed through for easier machining in the outer area machining operation S130 later.

Furthermore, in the outer area machining operation S130, the raw material 2002 machined to the outer ring component 2102 may correspond to the outer ring component 2102, and an inner peripheral surface thereof may be grinded to a ring shape that is recessed concavely to form a portion of the plasma forming space 2103. The areas corresponding to the interiors of the inlet pipe 2112 and the outlet pipe 2113 also may be machined through grinding in the inner area machining area S110.

A fire polishing operation S111 may be performed on the raw materials 2001a and 2002a, on which the inner area machining operation S110 has been performed.

Figure 20:
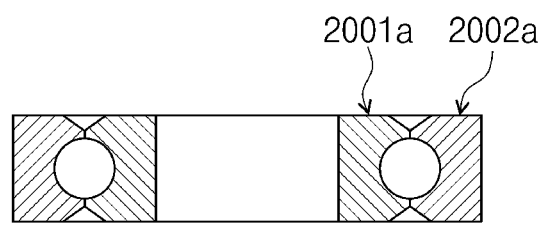
FIG. 20 is a cross-sectional view illustrating an example of raw materials coupled to each other to be assembled in an assembling operation of FIG. 17.

FIG. 20 is a cross-sectional view illustrating an example of raw materials 2001a and 2002a coupled to each other to be assembled in the assembling operation S120 of FIG. 17.

Referring to FIG. 20, in the assembling operation S120, the components 2001a and 2002a are assembled. According to an embodiment, in the assembling operation S120, in a state, in which the raw materials 2001a and 2002a, on which the inner area machining operation S110 has been performed, contact each other, they are assembled through welding of 2,500° C. or more using a torch using a mixture gas 02 and hydrogen H2 and a quartz welding rod. The welding is performed along an inclined surface formed at an outer corner of a border surface of the raw materials 2001a and 2002a, that is, along an assembly line. In the assembling operation S120, the components that constitutes the inlet pipe, the outlet pipe, and the outer ring component when the inlet pipe and the outlet pipe are separately machined from the outer ring component or when the outer ring component is separately machined and assembled also may be assembled in the same method as the above-described method.

A fire polishing operation S121 may be performed on the raw materials 2001a and 2002a, on which the assembling operation S120 has been performed.

Figure 21:
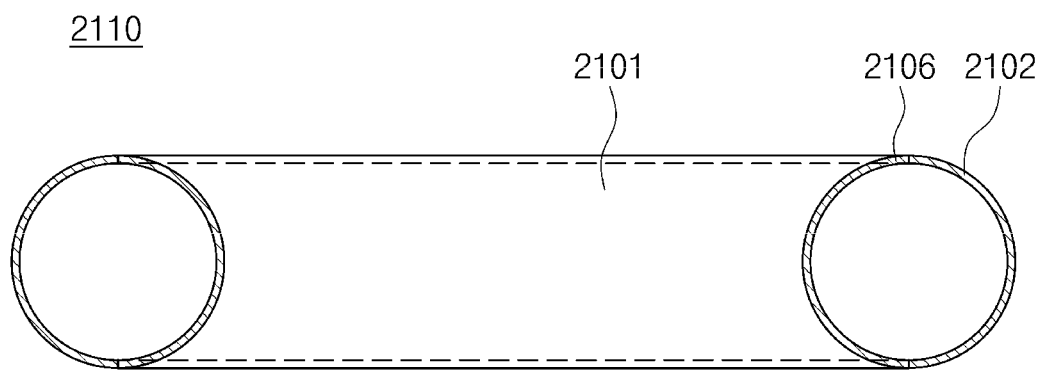
FIG. 21 is a cross-sectional view illustrating an example 2110 of a reactor after an outer area machining operation of FIG. 17 has been performed.

FIG. 21 is a cross-sectional view illustrating an example 2110 of a reactor after the outer area machining operation S130 of FIG. 17 has been performed.

Referring to FIGS. 17, 20, and 21, the outer area machining operation S130 may be performed after the assembly operation S120. In the outer area machining operation S130, areas of the raw materials 2001a and 2002a, on which the assembling operation S120 has been performed, corresponding to the outer surface of the reactor 2110 are machined. According to an embodiment, the outer surfaces of the raw materials 2001a and 2002a, on which the assembling operation S120 has been performed such that they are assembled, are grinded to be machined to have the shape of the reactor 2110. The areas corresponding to the exteriors of the inlet pipe 2112 and the outlet pipe 2113 also may be machined through grinding in the outer area machining area S130.

A fire polishing operation S131 may be performed on the reactor 2110, on which the outer area machining operation S130 has been performed.

The polishing operation S140 may be performed after the outer area machining operation S130 has been performed. According to an embodiment, in the polishing operation S140, a polishing operation is performed on a surface of the reactor 2110, on which the outer area machining operation S130 has been performed, by using compounds.

The size and shape inspecting operation S150 may be performed after the polishing operation 140 has been performed. According to an embodiment, in the size and shape inspecting operation S150, a size and a shape of the reactor 2110, on which the polishing operation S140 has been performed, may be inspected by using a jig.

The stress eliminating operation S160 may be performed on the reactor 2110 that has undergone the size and shape inspecting operation S150. According to an embodiment, in the stress eliminating operation S160, stresses of the reactor 2110 may be eliminated by performing an annealing operation of slowly cooling the reactor 2110 for 12 hours after heating the reactor 2110 in a furnace at 400° C. for 1 hour.

The local stress inspecting operation S170 may be performed after the stress eliminating operation S160 has been performed. According to an embodiment, in the local stress inspecting operation S170, a local stress of the reactor 2110, on which the stress eliminating operation S160 has been performed, may be inspected by using a polarization microscope.

The cleaning operation S180 may be performed after the local stress inspecting operation S170 has been performed. According to an embodiment, in the cleaning operation S180, a cleaning operation may be performed on the reactor 2110 that has undergone the local stress inspecting operation S170 may be performed by using sand blasting.

In the thermal spray coating operation S190, thermal spray coating is performed in the reactor 2110, on which the cleaning operation S180 has been performed. In an embodiment, in the thermal spray coating operation S190, plasma thermal spray coating may be performed on the reactor 2110, on which the cleaning operation S180 has been performed.

As described above, in the reactors according to the embodiments of the inventive concept, the assembly line of the components may be formed to deviate from an area having a relatively high density of plasma. Accordingly, an amount of particles that may be generated in the assembly line through the plasma reaction may be minimized.

The reactor according to the embodiment of the inventive concept is configured such that the assembly line deviates from an area, in which a density of a plasma loop is concentrated.

Further, the reactor according to the embodiment of the inventive concept may reduce an amount of generated particles.

An embodiment of the inventive concept provides a process processing apparatus that includes the reactor.

Although the preferred embodiment of the inventive concept has been described until now, it can be understood by an ordinary person in the art that the inventive concept may be variously corrected and changed without departing from the spirit and area of the inventive concept described in the claims.

Accordingly, the technical scope of the inventive concept is not limited to the contents descried in the detailed description, but should be determined by the claims.

What is claimed is:

1. A reactor comprising:
a body, in which a plurality of components are assembled, including a toroid shape and a plasma forming space in an interior thereof,
wherein the components include an inner ring component including an inner line that is closest to a central portion of the toroid shape of the body and an outer ring component surrounding an outside of the inner ring component, and
wherein an assembly line for the components is formed along a line spaced apart from the inner line.

2. The reactor of claim 1, wherein the inner ring component corresponds to an area extending from the inner line of the body to opposite sides along an outer peripheral direction thereof, and is provided in a range of 20% to 95% of the body with respect to a cross-section obtained by cutting an area, except for an area, in which an inlet and an outlet of the body are formed, in a direction that is perpendicular to a direction, the body surrounds the central portion of the toroid shape.

3. The reactor of claim 1, wherein the outer ring component includes a plurality of outer components.

4. The reactor of claim 1, wherein the body has an inlet, through which a gas is introduced into the plasma forming space, and an outlet, through which a fluid is discharged from the plasma forming space to an outside, and
wherein the reactor further includes:
an inlet pipe assembled in an area surrounding the inlet; and
an outer pipe assembled in an area surrounding the outlet.

5. The reactor of claim 4, further comprising:
a distribution member configured to distribute the gas introduced through the inlet pipe,
wherein the distribution member is integrally formed with the inlet pipe.

6. The reactor of claim 1, wherein the number of at least one of inlets and outlets is plural.

7. The reactor of claim 1, wherein the body includes a plurality of sub-bodies,
wherein the sub-bodies have toroid shapes, central portions of the toroid shapes are arranged along an imaginary straight line, and a direction, in which the central portions of the toroid shapes of the sub-bodies are surrounded, is perpendicular to the imaginary straight line.

8. A process processing apparatus comprising:
a process chamber configured to treat a substrate; and
a plasma treatment apparatus configured to supply plasma to the process chamber,
wherein the plasma treatment apparatus includes a reactor formed by assembling a plurality of components,
wherein the reactor includes a body having a toroid shape and a plasma forming space in an interior thereof, and having an inlet, through which a gas is introduced into the plasma forming space, and an outlet, through which a fluid is discharged from the plasma forming space to an outside, wherein the components include an inner ring component including an inner line that is closest to a central portion of the toroid shape of the body and an outer ring component surrounding an outside of the inner ring component, and wherein an assembly line for the components is formed along a line spaced apart from the inner line.

9. A method for manufacturing a reactor formed by assembling a plurality of components, wherein the reactor includes a body having a toroid shape and a plasma forming space in an interior thereof, and having an inlet, through which a gas is introduced into the plasma forming space, and an outlet, through which a fluid is discharged from the plasma forming space to an outside, and the body includes an inner ring component including an inner line that is closest to a central portion of the toroid shape and an outer ring component surrounding an outside of the inner ring component, and an assembly line for the components is formed along a line spaced apart from the inner line, and wherein the method includes:

forming the components by machining a raw material; and assembling the components.

10. The method of claim 9, wherein the forming of the components includes:

machining an area of the raw material corresponding to an inner surface of the reactor; and machining an area of the raw material corresponding to an outer surface of the reactor, and wherein the machining of the area of the raw material corresponding to the inner surface of the reactor is performed before the assembling of the components, and the machining of the area of the raw material corresponding to the outer surface of the reactor is performed after the assembling of the components.

11. The method of claim 9, wherein in the assembling of the components, the components are assembled through welding.

* * * * *